(12) United States Patent
Folske et al.

(10) Patent No.: US 12,150,523 B2
(45) Date of Patent: *Nov. 26, 2024

(54) DETERMINING FOOTWEAR REPLACEMENT BASED ON PIEZOELECTRIC OUTPUT

(71) Applicant: NIKE, Inc., Beaverton, OR (US)

(72) Inventors: Keith A. Folske, Wilsonville, OR (US);
Vikram Malhotra, Portland, OR (US);
Holli Pheil, Portland, OR (US);
Summer L. Schneider, Portland, OR (US)

(73) Assignee: NIKE, Inc., Beaverton, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/244,491

(22) Filed: Sep. 11, 2023

(65) Prior Publication Data

US 2024/0065368 A1 Feb. 29, 2024

Related U.S. Application Data

(63) Continuation of application No. 17/833,000, filed on Jun. 6, 2022, now Pat. No. 11,751,626, which is a
(Continued)

(51) Int. Cl.
*A43B 3/38* (2022.01)
*A43B 5/00* (2022.01)
(Continued)

(52) U.S. Cl.
CPC .............. *A43B 3/38* (2022.01); *A43B 5/00* (2013.01); *A43D 999/00* (2013.01);
(Continued)

(58) Field of Classification Search
None
See application file for complete search history.

(56) References Cited

U.S. PATENT DOCUMENTS

| 5,495,682 A | 3/1996 | Chen |
| 6,160,254 A * | 12/2000 | Zimmerman ............ A43B 5/06 36/114 |

(Continued)

FOREIGN PATENT DOCUMENTS

| CN | 102058197 A | 5/2011 |
| CN | 102177647 A | 9/2011 |

(Continued)

OTHER PUBLICATIONS

U.S. Appl. No. 15/575,898, filed Nov. 21, 2017, Wearable Article With a Kinetic Energy Generator.
(Continued)

*Primary Examiner* — Eric Blount
(74) *Attorney, Agent, or Firm* — Schwegman, Lundberg & Woessner, P.A.

(57) ABSTRACT

An article of apparel, a system, and methods include a structural material configured to enable the article of footwear to the worn on a body. A wireless transmission circuit is included and a piezoelectric generator is positioned with respect to the structural material in a configuration to be flexed to induce a voltage signal output. A voltage sensor is configured to sense the voltage profile and output a sensor signal indicative of the voltage profile. An electronic data storage, coupled to the voltage sensor, is configured to store voltage profile information based on the sensor data. A comparator, coupled to the electronic data storage, is configured to identify a change in the voltage profile information over time. The wireless transmission circuit is configured to transmit data indicative of a physical status of the article of footwear based on the change in the voltage profile information over time.

28 Claims, 11 Drawing Sheets

Related U.S. Application Data continuation of application No. 16/821,123, filed on Mar. 17, 2020, now Pat. No. 11,350,693, which is a continuation of application No. 16/369,066, filed on Mar. 29, 2019, now Pat. No. 10,595,583, which is a continuation of application No. 15/575,837, filed as application No. PCT/US2016/034808 on May 27, 2016, now Pat. No. 10,321,732.

(60) Provisional application No. 62/168,487, filed on May 29, 2015, provisional application No. 62/168,535, filed on May 29, 2015, provisional application No. 62/168,509, filed on May 29, 2015.

(51) Int. Cl.

| | | |
|---|---|---|
| A43D 999/00 | (2006.01) | |
| G01C 22/00 | (2006.01) | |
| G08B 5/22 | (2006.01) | |
| H02N 2/18 | (2006.01) | |
| H10N 30/30 | (2023.01) | |

(52) U.S. Cl.
CPC ............. *G01C 22/006* (2013.01); *G08B 5/22* (2013.01); *H02N 2/181* (2013.01); *H10N 30/30* (2023.02)

(56) References Cited

U.S. PATENT DOCUMENTS

| | | | |
|---|---|---|---|
| 7,429,805 B2 | 9/2008 | Hamel et al. | |
| 7,911,339 B2* | 3/2011 | Vock | G01N 33/00 340/693.1 |
| 9,095,184 B2 | 8/2015 | Tseng | |
| 9,301,569 B2 | 4/2016 | Donovan et al. | |
| 9,410,857 B2 | 8/2016 | Walker | |
| 9,773,395 B2 | 9/2017 | Visweswara et al. | |
| 9,810,591 B2 | 11/2017 | Walker | |
| 9,888,337 B1 | 2/2018 | Zalewski et al. | |
| 9,894,471 B1 | 2/2018 | Zalewski et al. | |
| 10,142,822 B1 | 11/2018 | Zalewski et al. | |
| 10,187,773 B1 | 1/2019 | Zalewski et al. | |
| 10,321,732 B2 | 6/2019 | Folske et al. | |
| 10,595,583 B2 | 3/2020 | Folske et al. | |
| 11,350,693 B2* | 6/2022 | Folske | A43D 999/00 |
| 11,751,626 B2* | 9/2023 | Folske | G06F 1/3212 340/539.1 |
| 2001/0049890 A1 | 12/2001 | Hirsch et al. | |
| 2004/0078662 A1 | 4/2004 | Hamel et al. | |
| 2005/0105231 A1* | 5/2005 | Hamel | H02J 7/345 361/90 |
| 2005/0258717 A1 | 11/2005 | Mullen | |
| 2006/0021261 A1 | 2/2006 | Face | |
| 2006/0152377 A1* | 7/2006 | Beebe | A43B 3/34 340/665 |
| 2007/0169381 A1 | 7/2007 | Gordon | |
| 2008/0082025 A1 | 4/2008 | Hughes et al. | |
| 2008/0083139 A1 | 4/2008 | Mullen | |
| 2009/0095050 A1 | 4/2009 | Profit et al. | |
| 2009/0278707 A1* | 11/2009 | Biggins | A43B 3/34 36/25 R |
| 2010/0090477 A1* | 4/2010 | Keating | A43B 3/34 340/870.07 |
| 2011/0054359 A1 | 3/2011 | Sazonov et al. | |
| 2013/0074375 A1 | 3/2013 | Chang et al. | |
| 2014/0062703 A1 | 3/2014 | Purks et al. | |
| 2014/0277632 A1 | 9/2014 | Walker | |
| 2014/0288856 A1 | 9/2014 | Vock et al. | |
| 2014/0368157 A1 | 12/2014 | Alexander et al. | |
| 2016/0275771 A1 | 9/2016 | Visweswara et al. | |
| 2016/0338441 A1 | 11/2016 | London | |
| 2016/0346613 A1 | 12/2016 | Schneider et al. | |
| 2017/0208890 A1 | 7/2017 | Torvinen et al. | |
| 2018/0125147 A1 | 5/2018 | Folske et al. | |
| 2018/0140039 A1 | 5/2018 | Folske et al. | |
| 2018/0146738 A1 | 5/2018 | Folske et al. | |
| 2018/0146739 A1 | 5/2018 | Malhotra et al. | |
| 2019/0223542 A1 | 7/2019 | Folske et al. | |
| 2020/0214386 A1 | 7/2020 | Folske et al. | |
| 2022/0354212 A1 | 11/2022 | Folske et al. | |

FOREIGN PATENT DOCUMENTS

| | | |
|---|---|---|
| CN | 102319130 A | 1/2012 |
| CN | 107847006 A | 3/2018 |
| CN | 107852111 A | 3/2018 |
| CN | 107847006 B | 4/2022 |
| DE | 4412522 C1 | 7/1995 |
| DE | 10325805 A1 | 1/2005 |
| EP | 2286683 A1 | 2/2011 |
| EP | 2597648 A2 | 5/2013 |
| EP | 2960897 A1 | 12/2015 |
| EP | 2675311 B1 | 12/2016 |
| EP | 3302129 B1 | 9/2020 |
| JP | 2002209607 A | 7/2002 |
| KR | 1020030008389 A | 1/2003 |
| KR | 1020110043030 A | 4/2011 |
| KR | 1020140059976 A | 5/2014 |
| KR | 1020150048019 A | 5/2015 |
| WO | WO-9514430 A1 | 6/1995 |
| WO | WO-0078170 A1 | 12/2000 |
| WO | WO-2007047889 A2 | 4/2007 |
| WO | WO-2014034944 A1 | 3/2014 |
| WO | WO-2016196349 A1 | 12/2016 |
| WO | WO-2016196357 A1 | 12/2016 |
| WO | WO-2016196363 A1 | 12/2016 |

OTHER PUBLICATIONS

U.S. Appl. No. 15/575,837 U.S. Pat. No. 10,321,732, Nov. 21, 2017, Determining Footwear Replacement Based on Piezoelectric Output.

U.S. Appl. No. 16/821,123 U.S. Pat. No. 11,350,693, Mar. 17, 2020, Determining Footwear Replacement Based on Piezoelectric Output.

U.S. Appl. No. 16/369,066 U.S. Pat. No. 10,595,583, Mar. 29, 2019, Determining Footwear Replacement Based on Piezoelectric Output.

U.S. Appl. No. 17/833,000 U.S. Pat. No. 11,751,626, Jun. 6, 2022, Determining Footwear Replacement Based on Piezoelectric Output.

"U.S. Appl. No. 15/575,837, Corrected Notice of Allowability mailed May 13, 2019", 4 pgs.

"U.S. Appl. No. 15/575,837, Non Final Office Action mailed Aug. 27, 2018", 9 pgs.

"U.S. Appl. No. 15/575,837, Notice of Allowability mailed Apr. 17, 2019", 2 pgs.

"U.S. Appl. No. 15/575,837, Notice of Allowance mailed Feb. 8, 2019", 7 pgs.

"U.S. Appl. No. 15/575,837, Response filed Nov. 26, 2018 to Non Final Office Action mailed Aug. 27, 2018", 10 pgs.

"U.S. Appl. No. 15/575,898, Non Final Office Action mailed Mar. 8, 2019", 17 pgs.

"U.S. Appl. No. 16/369,066, Corrected Notice of Allowability mailed Feb. 5, 2020", 2 pgs.

"U.S. Appl. No. 16/369,066, Corrected Notice of Allowability mailed Feb. 21, 2020", 2 pgs.

"U.S. Appl. No. 16/369,066, Examiner Interview Summary mailed Aug. 7, 2019", 3 pgs.

"U.S. Appl. No. 16/369,066, Non Final Office Action mailed May 31, 2019", 8 pgs.

"U.S. Appl. No. 16/369,066, Notice of Allowance mailed Dec. 6, 2019", 8 pgs.

"U.S. Appl. No. 16/369,066, Response filed Oct. 31, 2019 to Non-Final Office Action mailed May 31, 2019", 10 pgs.

"U.S. Appl. No. 16/821,123, Examiner Interview Summary mailed Jan. 14, 2022", 2 pgs.

"U.S. Appl. No. 16/821,123, Non Final Office Action mailed Oct. 14, 2021", 14 pgs.

"U.S. Appl. No. 16/821,123, Notice of Allowance mailed Feb. 7, 2022", 8 pgs.

(56) References Cited

OTHER PUBLICATIONS

"U.S. Appl. No. 16/821,123, Response filed Jan. 13, 2022 to Non Final Office Action mailed Oct. 14, 2021", 10 pgs.
"U.S. Appl. No. 17/833,000, Non Final Office Action mailed Jan. 20, 2023", 6 pgs.
"U.S. Appl. No. 17/833,000, Notice of Allowance mailed May 4, 2023", 7 pgs.
"U.S. Appl. No. 17/833,000, Preliminary Amendment filed Jul. 28, 2022", 7 pgs.
"U.S. Appl. No. 17/833,000, Response filed Apr. 20, 2023 to Non Final Office Action mailed Jan. 20, 2023", 8 pgs.
"Chinese Application Serial No. 201680042249.6, Office Action mailed Jan. 30, 2019", w/ English summary, 14 pgs.
"Chinese Application Serial No. 201680042249.6, Response filed Jun. 14, 2019 to Office Action mailed Jan. 30, 2019", w/ current English claims, claims not amended in response, 10 pgs.
"Chinese Application Serial No. 201680043879.5, Decision of Rejection mailed Mar. 5, 2021", With English machine translation, 23 pgs.
"Chinese Application Serial No. 201680043879.5, Office Action mailed Jul. 27, 2020", w/Concise Statement of Relevance, 10 pgs.
"Chinese Application Serial No. 201680043879.5, Office Action mailed Dec. 30, 2019", With English translation, 24 pgs.
"Chinese Application Serial No. 201680043879.5, Request for Reexamination filed Jun. 21, 2021 to Decision of Rejection mailed Mar. 5, 2021", With English translation, 6 pages.
"Chinese Application Serial No. 201680043879.5, Response filed May 14, 2020 to Office Action mailed Dec. 30, 2019", w/ English claims, 52 pgs.
"Chinese Application Serial No. 201680043879.5, Response filed Dec. 9, 2020 to Office Action mailed Jul. 27, 2020", w/ English Claims, 9 pgs.
"Chinese Application Serial No. 201680043879.5, Response to Examiner Telephone Interview filed Jun. 30, 2021", With English claims, 17 pages.
"Chinese Application Serial No. 2016800438795, Office Action mailed Jul. 14, 2021", With English translation, 14 pages.
"Chinese Application Serial No. 2016800438795, Office Action mailed Oct. 19, 2021", With English translation, 8 pgs.
"Chinese Application Serial No. 2016800438795, Response filed Sep. 14, 2021 to Office Action mailed Jul. 14, 2021", w/ English claims, 17 pgs.
"Chinese Application Serial No. 2016800438795, Response filed Dec. 20, 2021 to Office Action mailed Oct. 19, 2021", w/ English claims, 17 pgs.
"European Application Serial No. 16804156.4, Extended European Search Report mailed Mar. 8, 2019", 9 pgs.
"European Application Serial No. 16804156.4, Response filed Jul. 23, 2018 to Communication Pursuant to Rules 161 and 162 mailed Jan. 12, 2018", 17 pgs.
"European Application Serial No. 16804156.4, Response filed Sep. 2, 2019 to Extended European Search Report mailed Mar. 8, 2019", Electronic Acknowledgement Receipt included in attachment due to date discrepency between date response filed and draft date of response, 38 pgs.
"European Application Serial No. 16804161.4, Extended European Search Report mailed Apr. 12, 2019", 8 pgs.
"European Application Serial No. 16804161.4, Response filed Jul. 26, 2018 to Communication Pursuant to Rules 161 and 162 EPC mailed Jan. 16, 2018", 20 pgs.
"European Application Serial No. 16804161.4, Response filed Nov. 5, 2019 to Extended European Search Report mailed Apr. 12, 2019", 67 pgs.
"European Application Serial No. 16804166.3, Extended European Search Report mailed Apr. 25, 2019", 9 pgs.
"European Application Serial No. 16804166.3, Response filed Jul. 26, 2018 to Communication Pursuant to Rules 161 and 162 EPC mailed Jan. 16, 2018", 16 pgs.
"European Application Serial No. 16804166.3, Response filed Oct. 31, 2019 to Extended European Search Report mailed Apr. 25, 2019", 35 pgs.
"International Application Serial No. PCT/US2016/034793, International Preliminary Report on Patentability mailed Dec. 14, 2017", 9 pgs.
"International Application Serial No. PCT/US2016/034793, International Search Report mailed Sep. 12, 2016", 5 pgs.
"International Application Serial No. PCT/US2016/034793, Written Opinion mailed Sep. 12, 2016", 8 pgs.
"International Application Serial No. PCT/US2016/034808, International Preliminary Report on Patentability mailed Dec. 14, 2017", 10 pgs.
"International Application Serial No. PCT/US2016/034808, International Search Report mailed Sep. 28, 2016", 3 pgs.
"International Application Serial No. PCT/US2016/034808, Written Opinion mailed Sep. 28, 2016", 8 pgs.
"International Application Serial No. PCT/US2016/034816, International Preliminary Report on Patentability mailed Dec. 14, 2017", 12 pgs.
"International Application Serial No. PCT/US2016/034816, International Search Report mailed Sep. 7, 2016", 3 pgs.
"International Application Serial No. PCT/US2016/034816, Written Opinion mailed Sep. 7, 2016", 10 pgs.

* cited by examiner

DETERMINING FOOTWEAR REPLACEMENT BASED ON PIEZOELECTRIC OUTPUT

PRIORITY CLAIM

This application is a continuation of U.S. patent application Ser. No. 17/833,000, filed Jun. 6, 2022, which application is a continuation of U.S. patent application Ser. No. 16/821,123, filed Mar. 17, 2020, issued on Jun. 6, 2022 as U.S. Pat. No. 11,350,693, which application is a continuation of U.S. patent application Ser. No. 16/369,066, filed Mar. 29, 2019, issued on Mar. 24, 2020 as U.S. Pat. No. 10,595,583, which application is a continuation of U.S. patent application Ser. No. 15/575,537, filed Nov. 21, 2017, issued on Jun. 18, 2019 as U.S. Pat. No. 10,321,732, which application is a U.S. National Stage 371 application from International Application No. PCT/US2016/034808, filed May 27, 2016, which application claims the benefit of priority of U.S. Provisional Patent Application Ser. No. 62/168,509, filed on May 29, 2015, and of U.S. Provisional Patent Application Ser. No. 62/168,487, filed on May 29, 2015, and of U.S. Provisional Patent Application Ser. No. 62/168,535, filed on May 29, 2015, the benefit of priority of each of which is claimed hereby, and each of which is incorporated by reference herein in its entirety.

TECHNICAL FIELD

The subject matter disclosed herein generally relates to an article of apparel with a kinetic energy generator.

BACKGROUND

Mobile and wearable electronics conventionally combine compact electronic components with a self-contained, non-volatile power source. The power source, such as a battery, supercapacitor, and the like, may provide power for sensors, controllers, communications, and so forth. Data to and from the electronics may be transmitted via various forms of wired and wireless communications.

BRIEF DESCRIPTION OF THE DRAWINGS

Some embodiments are illustrated by way of example and not limitation in the figures of the accompanying drawings.

DETAILED DESCRIPTION

Example methods and systems are directed to a wearable article with a kinetic energy generator. Examples merely typify possible variations. Unless explicitly stated otherwise, components and functions are optional and may be combined or subdivided, and operations may vary in sequence or be combined or subdivided. In the following description, for purposes of explanation, numerous specific details are set forth to provide a thorough understanding of example embodiments. It will be evident to one skilled in the art, however, that the present subject matter may be practiced without these specific details.

Various wearable articles, such as shoes or other articles of footwear, include structure that is intended to provide comfort and/or support to the wearer of the shoe. In the case of a shoe, for instance, an insole and outsole may provide cushioning for the foot and support for features of the foot and leg, such as an arch of the foot and ankles of the wearer, among many other potential areas of support and comfort. However, as a shoe is worn the structure of the shoe tends to break down or otherwise change. Cushioning may become compressed or otherwise provide less cushioning with time. Arch support structures may lose resilience, thereby providing less support. In general, the shoe may tend to become more flexible and less supportive with time.

Because the shoe may become less resilient with time, the voltage output from a piezoelectric generator positioned within the shoe may tend to change as well. Less resistance to flexing the shoe may predictably result in the shoe flexing faster, producing outputs from the piezoelectric generator that is both shorter and higher amplitude as the shoe ages and the physical status of the shoe deteriorates. By comparing the voltage output of the piezoelectric generator early in the useful life of the shoe with the voltage output as the shoe is worn, inferences may be made as to the physical status of the shoe. When the voltage output shows sufficient change over time, the physical status of the shoe may be interpreted as having exceeded the useful life of the shoe and replacement of the shoe is recommended. The physical status of the shoe may be conveyed to the wearer of the shoe to encourage replacement.

Figure 1A:
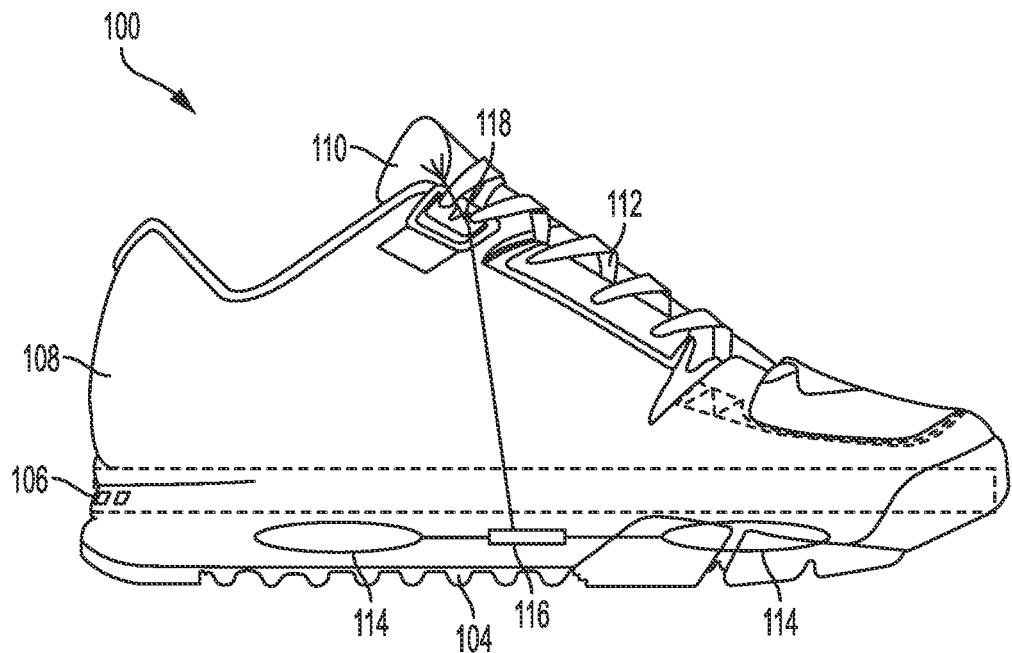
FIGS. 1A and 1B are a cutaway depiction of a wearable article and a block circuit diagram of electronic components of the wearable article, in an example embodiment.
Figure 1B:
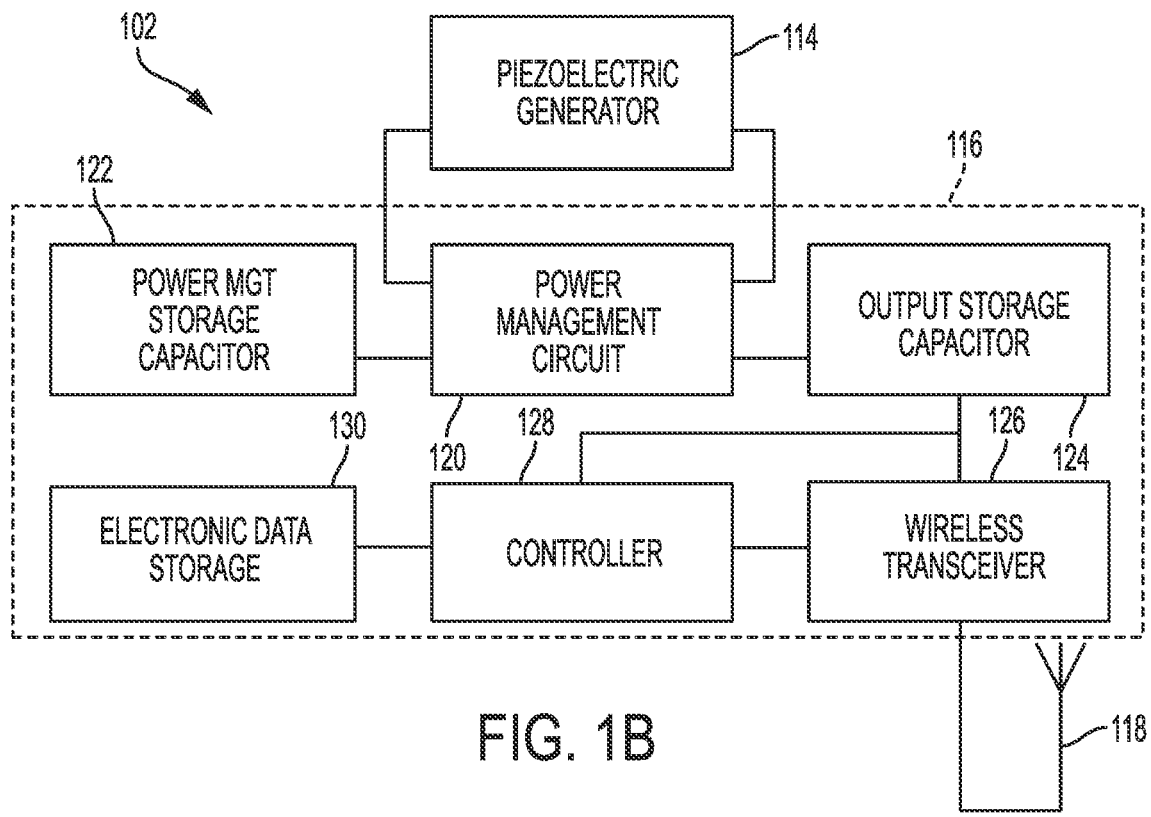

FIGS. 1A and 1B are a cutaway depiction of a wearable article 100 and a block circuit diagram 102 of electronic components of the wearable article 100, in an example embodiment. As illustrated, the wearable article 100 is an article of footwear. However, it is to be understood that while the principles described herein are with specific reference to the wearable article 100, the principles described herein may be applied to any suitable wearable article, such as articles of apparel, including shirts, pants, socks, hats, and the like, without limitation.

The wearable article 100 includes an outsole 104 designed to come into contact with a surface, such as the ground or a floor, an insole 106 configured to seat a human foot, an upper section 108 configured to enclose the human foot, and a tongue 110 configured to facilitate securing the wearable article 100 to the human foot via laces 112. It is to be recognized that this is a simplified depiction of a conventional wearable article 100 and that various wearable articles 100 may incorporate any of a variety of components or features. Further, certain wearable articles 100 may not incorporate all of these features or may include these features in other formats (e.g., a sandal may incorporate the outsole 104 and a reconfigured upper section 106 and no insole 106, tongue 110, and laces 112). It is contemplated that the principles disclosed herein will be applicable and adaptable to any of a range of wearable articles 100.

The wearable article 100 further includes piezoelectric generators 114 coupled to electronic circuitry 116 and an antenna 118. The electronic circuitry 116 may include or be positioned on one or more circuit boards or other suitable substrates. As illustrated, the piezoelectric generators 114 and electronic circuitry 116 are seated, secured, or otherwise positioned within the outsole 104. In various examples, the outsole 104 forms a seal around the piezoelectric generators 114 and electronic circuitry 116 that is fully or substantially waterproof and otherwise configured to protect the piezoelectric generators 114 and electronic circuitry 116 from environmental conditions that may tend to damage or interfere with the operation of the piezoelectric generators 114 and electronic circuitry 116. In alternative example, the piezoelectric generators 114 and electronic circuitry 116 may be positioned in any suitable location on the wearable article 100.

As illustrated, the antenna 118 is electrically coupled to the circuit board 116 and is positioned within the tongue 112. While the tongue 112 may provide a prominent position for the antenna 118, the antenna 118 may be positioned anywhere on the wearable article 100 that will facilitate the antenna 118 conducting wireless communications with a secondary antenna position remote to the wearable article. Thus, for instance, the antenna 118 may be positioned in various portions of the upper section 108 or in the outsole 104 or insole 106, as appropriate.

Referring specifically to the block circuit diagram 102, the electronic circuitry 116 includes a power management circuit 120, a power management storage capacitor 122, an output storage capacitor 124, a wireless transceiver 126, a controller 128, and an electronic data storage 130.

The power management circuit 120 is coupled over the piezoelectric generator 114 (it is noted that, for simplicity, the piezoelectric generator 114 as illustrated in the block circuit diagram 102 represents as many piezoelectric generators as are included in the wearable article 100). In an example, the power management circuit 120 includes a power management integrated circuit and a rectifier. The power management circuit 120 controls the flow, direction, and magnitude of the power generated by the piezoelectric generator 114.

The power management circuit 120 is coupled to a power management storage capacitor 122. The power management storage capacitor 122 is sized and specified to charge at or based on voltage levels output by the power management circuit 120. The power management storage capacitor 122 is coupled to the output storage capacitor 124. The output storage capacitor 124 has a lower voltage rating than the power management storage capacitor 122 and is variously charged by charge transfer or leakage from the power management storage capacitor 122. As such, the output storage capacitor 124 provides a step-down in voltage from the voltage levels of the piezoelectric generator 114, power management circuit 120, and power management storage capacitor 122.

The output storage capacitor 124 is coupled to the wireless transceiver 126 and the controller 128. In an example, the wireless transceiver 124 is configured as a receiver without transmitting functionality. Alternatively, the wireless transceiver 124 may be configured to transmit and receive. The wireless transceiver 124 is configured to communicate according to one or more wireless modalities. In an example, the wireless modality is or is related to a Bluetooth low energy (BLE) standard. In an example, the BLE standard is specified in the Bluetooth Core Specification, Version 4.1 (December 2013).

Figure 2:
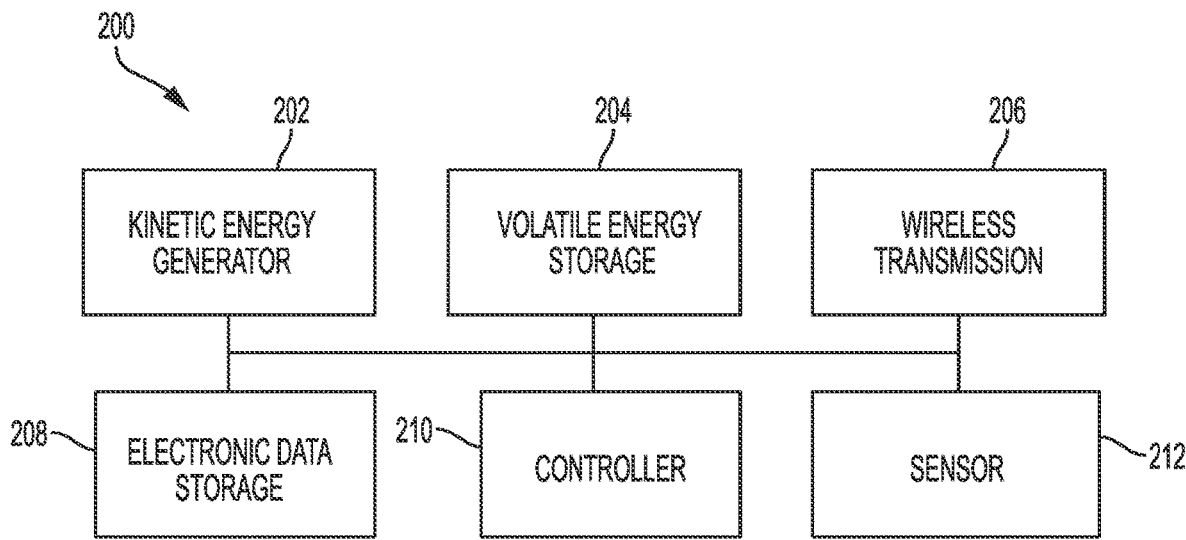
FIG. 2 is a block circuit diagram of electronic componentry that may be implemented in a wearable article, in an example embodiment.

FIG. 2 is a block circuit diagram 200 of electronic componentry that may be implemented in the wearable article 100, in an example embodiment. The block circuit diagram 200 includes the components of the block circuit diagram 102 as well as alternative and optional components. As such, the block circuit diagram 200 may describe circuit blocks that include components in addition or alternative to the components of the block circuit diagram 102.

The block circuit diagram 200 includes a kinetic energy generator block 202, a volatile energy storage block 204, a wireless transmission block 206, an electronic data storage block 208, an optional controller 210, and an optional sensor block 212. In various examples, the block circuit diagram 200 may be applied to any suitable wearable article and the components of the electronic system 200 adapted to the particular circumstances in which they have been applied.

The kinetic energy generator block 202 optionally includes the piezoelectric generators 114, as illustrated. In various examples, the kinetic energy generator block 202 may additionally or alternatively include kinematic generators and any other of a variety of kinetic energy generators known in the art or that may be developed. In such examples, the piezoelectric generators 114 may be replaced with or supplemented by the kinematic generators in the wearable article 100. The kinematic generators would not necessarily be placed in the outsole 104 like the piezoelectric generators 114 and may, instead, be positioned anywhere on the wearable article 100 as appropriate.

The kinetic energy generator block 202 produces a voltage and current based on physical motion. In the case of the piezoelectric generators 114, the voltage and current are produced based on a flexing of the piezoelectric generators 114 that results from the flexing of the wearable article 100. Thus, with the piezoelectric generators 114 positioned in the outsole 104 as illustrated, as the outsole 104 flexes, e.g., because of a wearer of the wearable article taking a step, the piezoelectric generators 114 also flex, resulting in the induced voltage and current. It is to be recognized that if a kinematic generator were incorporated in addition to or instead of the piezoelectric generators 114 then the voltage and current as generated may be based not in principal part on flexing of the wearable article 100 but on the movement of the wearable article 100 relative to a reference point, such as Earth's gravity. For instance, such movement may be based on the movement of a wearer's foot and leg during walking or running for an article of footwear or the swinging of the wearer's arm for a shirt, wristband, or the like.

The volatile energy storage block 204 includes a volatile energy storage component, such as a capacitor, and is positioned on the circuit board 116. The volatile energy storage block 204 is configured to store energy for relatively short periods of time, as understood in the art. Thus, for instance, while the volatile energy storage block 204 may store energy for time periods on the order of milliseconds or seconds, the volatile energy storage block 204 may not store energy in a form that is resilient for hours, days, or more, in contrast to a battery, a supercapacitor, and the like. The volatile energy storage block 204 may include the output storage capacitor 124 as well as the input storage capacitor 122, in certain embodiments.

The wireless transmission block 206 includes componentry that may be utilized to transmit data stored in the electronic data storage block 208. The wireless transmission block 206 may include the antenna 118 and the wireless transceiver 126. In such an example and others, the wireless transmission block 206 may be or may optionally function as a wireless transceiver block, configured to both transmit and receive data in wireless signals. Alternatively, the wireless transmission block 206 may include only wireless transmission circuitry and may not be configured to receive wireless signals.

The wireless transmission block 206 may utilize any suitable wireless transmission or transceiver system, including near field communications (NFC), radio frequency identification (RFID) technologies, and the like that may be powered based on the storage and output of the volatile energy storage block 204. The wireless transmission block 206 may utilize or incorporate the circuit board 116 which may be or which may incorporate a dedicated substrate or "tag" on which to position the components of the wireless transmission block 206, such as an RFID tag known in the art.

In various examples, the electronic data storage block 208 is or includes the electronic data storage 130. In certain examples, the electronic data storage block 208 is non-volatile, writeable electronic data storage, such as an electrically erasable programmable read-only memory (EEPROM), such as flash memory, or any other suitable non-volatile electronic data storage known in the art. However, it is to be understood that, in various additional or alternative examples, the electronic data storage block 208 may be or may include volatile electronic data storage, such as random access memory (RAM) or other suitable volatile electronic data storage known in the art.

The electronic data storage block 208 includes electronic data that is related to some or all of the wearable article 100, an owner of the wearable article, a manufacturer of the wearable article 100, or any other information that may be pertinent to various circumstances. In various examples, the information includes a make, model, and unique identifier, such as a serial number, of the wearable article 100, a name or other identifier of the owner or original purchaser of the wearable article, proprietary information related to the manufacturer of the wearable article 100, including information related to the place, date, and circumstances of the manufacture of the wearable article 100, the place, date, and circumstances of the purchase of the wearable article 100, purchase history of the owner or original purchaser of the wearable article 100, including items other than or in addition to the wearable article 100, a current date and time, and so forth. Further information may be added to the electronic data storage block 208 over time, including a step counter and a clock. Additional information may be stored in the electronic data storage block 208 as disclosed herein or as may be appropriate or desired.

In an example, the electronic data storage block 208 is configured to store a 16-bit current date, an 18-bit current time, a counter of accumulated steps taken by or in the wearable article 100 in twenty-two (22) bits of storage, and a unique identification number of the wearable article 100 or the purchaser or user of the wearable article 100 in thirty (30) bits of storage, for a total of eighty-six (86) bits. In an example, the electronic data storage block 208 is only or substantially only sufficiently large to store the eighty-six (86) bits or any number of bits as may be necessary to store the desired information. Alternatively, the electronic data storage block 208 may incorporate sufficient electronic data storage to store, for instance, time-stamped data regarding when individual steps are taken.

A dedicated controller 210 is optionally included to provide dedicated control function for the componentry of the block circuit diagram 200. The controller 210 may be or may include the controller 128. The controller 210 obtains inputs from various blocks of the circuit diagram 200 and controls the operation of various blocks as disclosed herein. In various examples, control circuitry of various blocks, including the wireless transmission block 206 and the electronic data storage block 208 may obviate the need or utility of a separate controller 210. In such circumstances, individual blocks may perform the functions and operations disclosed herein on an individual basis as appropriate without use of a central controller 210. Alternatively, the controller 210 may be understood to be an amalgamation of all control functionality of the block circuit diagram 200, including from a dedicated controller as well as native control functions of individual blocks.

The optional sensor block 212 includes sensors that may be utilized in recording operational or use data of the wearable article 100. In an example, the sensor block 212 includes an accelerometer. The accelerometer outputs data indicative of acceleration of the wearable article to the controller 210. The controller 210 may variously covert the accelerometer output to data indicative of a number of steps a wearer of the wearable article has taken and store the data in the electronic data storage block 208 or may store the raw accelerometer output data in the electronic data storage block 208. The steps and/or accelerometer data may then be output by the electronic data storage block 208 as desired, for instance for transmittal to a receiver via the wireless transmission block 204.

The sensor block 212 may, in various examples, include one or more additional sensors instead of or in addition to the accelerometer. Such additional sensors may include some or all of a gyroscope, a moisture sensor, a magnetometer, a light sensor, a pressure sensor, a shear-force sensor, and a sweat sensor, among other suitable sensors. As with the accelerometer example, data output from the individual sensors may variously be interpreted by the controller 210 and data or information related to the interpretation stored in the electronic data storage block 208, or raw data from the various sensors may be stored in the electronic data storage block 208.

Figure 3:
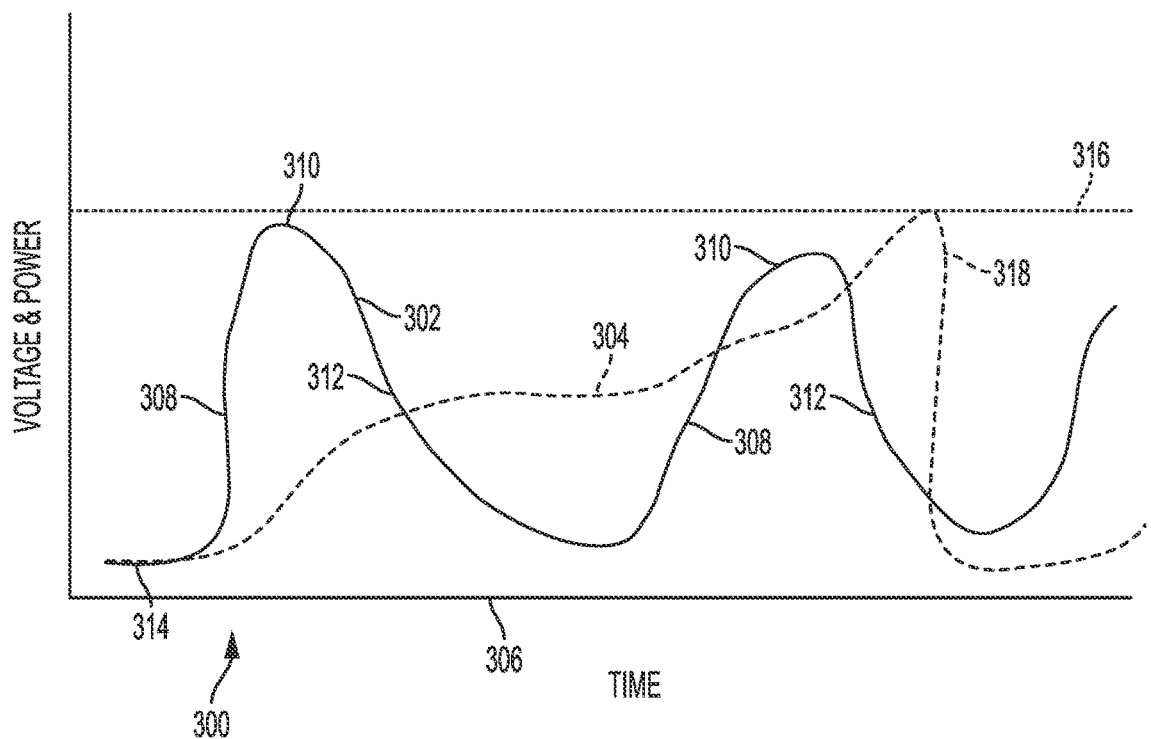
FIG. 3 is a graph 300 of a voltage output of a piezoelectric generator and an amount of energy stored in an output storage capacitor over time, in an example embodiment.

FIG. 3 is a graph 300 of a voltage output 302 of the piezoelectric generator 114 and an amount of energy stored 304 in the output storage capacitor 124 over time 306, in an example embodiment. While the graph 300 is described with respect to the stated components of the wearable article 100 in particular, it is to be understood that the graph 300 and the principles that underlie the graph 300 may be applied to the kinetic energy generator block 202 and the volatile energy storage block 204 in general. The graph is abstracted to illustrate the principles of use of the wearable article 100 and the precise morphology of voltage 302 and energy stored 304 curves may vary depending on any of a variety of circumstances of use of the wearable article 100 and particular implementations of the components of the wearable article 100.

As the piezoelectric generator 114 is flexed, for instance while the wearable article 100 is being worn and the wearer is walking, running, or otherwise stepping or making footfalls, the voltage response is generated by the piezoelectric generator 114 and the voltage output 302 is transmitted to the power management circuit 120 and, ultimately, to the output storage capacitor 124. Where the voltage output 302 reflects a standard stepping action, the voltage output 302 includes a rise 308, peak 310, and fall 312 back to a baseline 314 for each step. Dependent on the lag introduced by the power management circuit 120 and power management storage capacitor 122, the voltage output 302 ultimately results in energy that is delivered to and stored in the output storage capacitor 124.

Unlike the voltage output 302, the energy stored 304 on the output voltage capacitor 124 is substantially retained. While some energy may leak from the output voltage capacitor 124 over time, over a period of one or several seconds the leaked energy may be minimal or effectively negligible for the purposes of this illustrative example. Thus, as the voltage output 302 increases and decreases with each step, the energy stored 304 tends to increase over time in proportion to the amount of voltage generated over time.

Energy stored 304 in the output storage capacitor 124 may be utilized for a variety of purposes related to the components of the block circuit diagram 102, 200. The energy stored 304 may be utilized to operate the controller 128, 210 and sensor block 212, among other components. When the energy stored 304 is utilized for such a purpose the energy stored 304 may decrease with time in relation to the energy utilized to operate the components that are utilizing the power.

The wireless transceiver 126 similarly draws power from the output storage capacitor 124. However, the wireless transceiver 126 may require an amount of energy that is substantially higher than the energy utilized by other components of the block circuit diagrams 102, 200 in order to transmit data at a suitable or desired signal strength. An energy stored threshold 316 corresponding to the amount of energy needed by the wireless transceiver 126 may be predetermined and set.

Upon the energy stored 304 exceeding the threshold 316, the output storage capacitor 124 is discharged 318 to temporarily and discretely power the wireless transceiver 126. The wireless transceiver 126 thus advertises or "bursts" data that is stored in the electronic data storage 130. In various examples, each advertisement burst variously lasts either a predetermined time or for an amount of time sufficient to transmit the data as specified by the controller 128. As an advertisement, the wireless transceiver 126 does not transmit data to a particular destination but rather transmits the data such that the data may be received by any suitable receiver within communication range of the wireless transceiver 126.

The voltage output 302 as illustrated with multiple peaks 310 may represent a single step, with one step corresponding to one peak 310 in examples with only one piezoelectric generator, or individual actuations of multiple piezoelectric generators 114 over the course of a single step. Accordingly, the illustrated example voltage output 302 may be generated over the course of a single step when a piezoelectric generator 114 positioned at the front of the wearable article 100 flexes when the heel rises off the ground at the start of a step and then when a piezoelectric generator at the back of the wearable article 100 is actuated when the heel of the wearer strikes the ground at the completion of the step.

Individual wireless bursts may include various types of data, as disclosed herein. In various examples, each burst includes an identifier of the article of footwear. In certain examples, each burst includes only the identifier of the article of footwear. In other examples, each burst includes the identifier of the article and any or all of the data pertaining to the wearable article 100, the owner or initial purchaser of the wearable article 100, the manufacturer of the wearable article 100, and so forth.

Wireless bursts may also include data that is based on the output of the sensor block 212, if included. Thus, in an example where the sensor block 212 is or includes an accelerometer, the controller 128, 210, based on its interpretation of the output from the accelerometer, notes acceleration profiles that correspond to steps being taken by a wearer of the wearable article 100 and, for each step, incrementing a step counter that is stored in the electronic data storage 130. In such an example, some or all of the wireless bursts include the step counter value.

The controller 210 may further identify steps based on characteristics of the voltage output 302. In an example, characteristics of the voltage output 302 may be known to correspond to a step, such as the peak voltage 310 and the rise 308 and fall 312. For instance, a step may be identified if the peak voltage 310 meets or exceeds a predetermined step threshold voltage. By way of further example, a step may be identified if the peak voltage 310 meets or exceeds the predetermined step threshold voltage and at least one of the rise 308 and the fall 312 is within a particular duration window, e.g., because the rise 308 or fall 312 was neither too fast nor too slow to have been caused by a step or footfall. The characteristics of the voltage output 302 that indicate a step may be highly dependent on the characteristics of the wearable article 100, such as the wearable article's 100 general stiffness, and the particular characteristics of a voltage output 302 that may be interpreted as a step may be separately and individually determined for a given wearable article 100.

The wireless bursts are, in various examples, without respect to the presence of another antenna to receive the wireless signals. In those examples, the wireless burst occurs when the energy stored threshold 316 is met. If a receiving antenna is within range of the antenna 118 at the time of the wireless burst then the information included in the wireless burst may be received and utilized. If a receiving antenna is not within range of the antenna 118 then the transmission from the antenna 118 may be lost or be unused.

Figure 4:
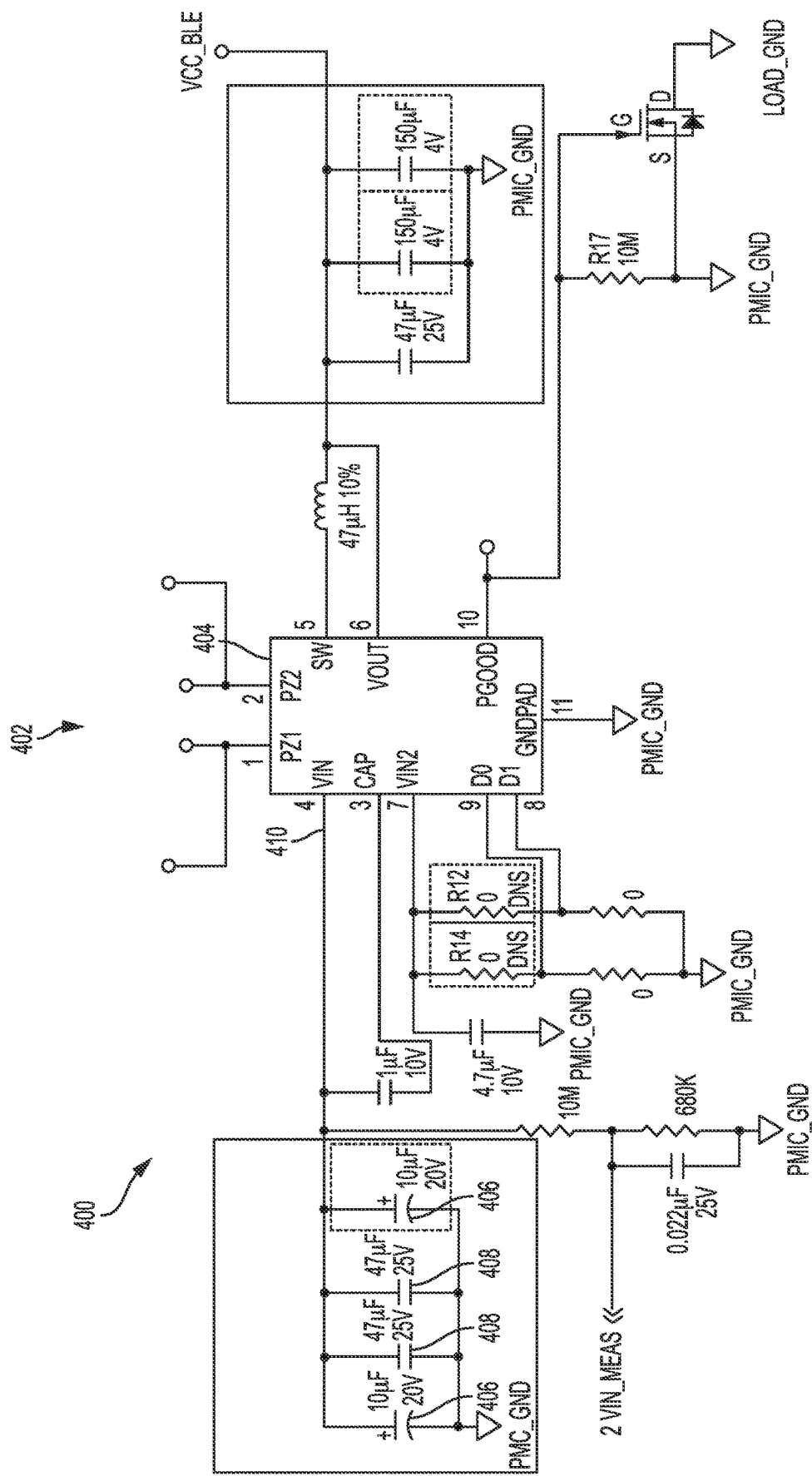
FIG. 4 is a circuit schematic of an implementation of power components of a block circuit diagram, in an example embodiment.

FIG. 4 is a circuit schematic 400 of an implementation of power components of the block circuit diagram 102, in an example embodiment. In particular, the circuit schematic provides an example embodiment of the piezoelectric generator 114, the power management circuit 120, the power management storage capacitor 122, and the output storage capacitor 124 blocks of the block circuit diagram.

In the illustrated example, the piezoelectric generator 114 is coupled to piezoelectric input terminals 402 of an energy harvester 404. In the illustrated example, the energy harvester is an LTC3588-1 energy harvester by Linear Technology Corporation, though it is emphasized than any suitable component, whether off the shelf or custom designed may be used instead of or in addition to the particular energy harvester illustrated with respect to this example embodiment.

Capacitors 406, 408 of the power management storage capacitor block 122 are coupled to a voltage input terminal 410 of the energy harvester 404. The capacitors 406, 408 are selected from two different types of capacitors with different electrical characteristics that, included together and in parallel, may provide a desired power management storage capacitance over a variety of voltages that may be generated by the piezoelectric generator 114. In particular, in the example embodiment, the capacitors include two tantalum capacitors 406, each with a capacitance of ten (10) microFarads and a voltage rating of twenty (20) Volts, and two ceramic capacitors 408, each with a capacitance of forty-seven (47) microFarads and a voltage rating of twenty-five (25) Volts. However, it is noted and emphasized that the power management storage capacitor block 122 may utilize any one or more capacitors as appropriate based on the circumstances of the implementation of the power management circuit 120 and the wearable article 100 in general.

Figure 5:
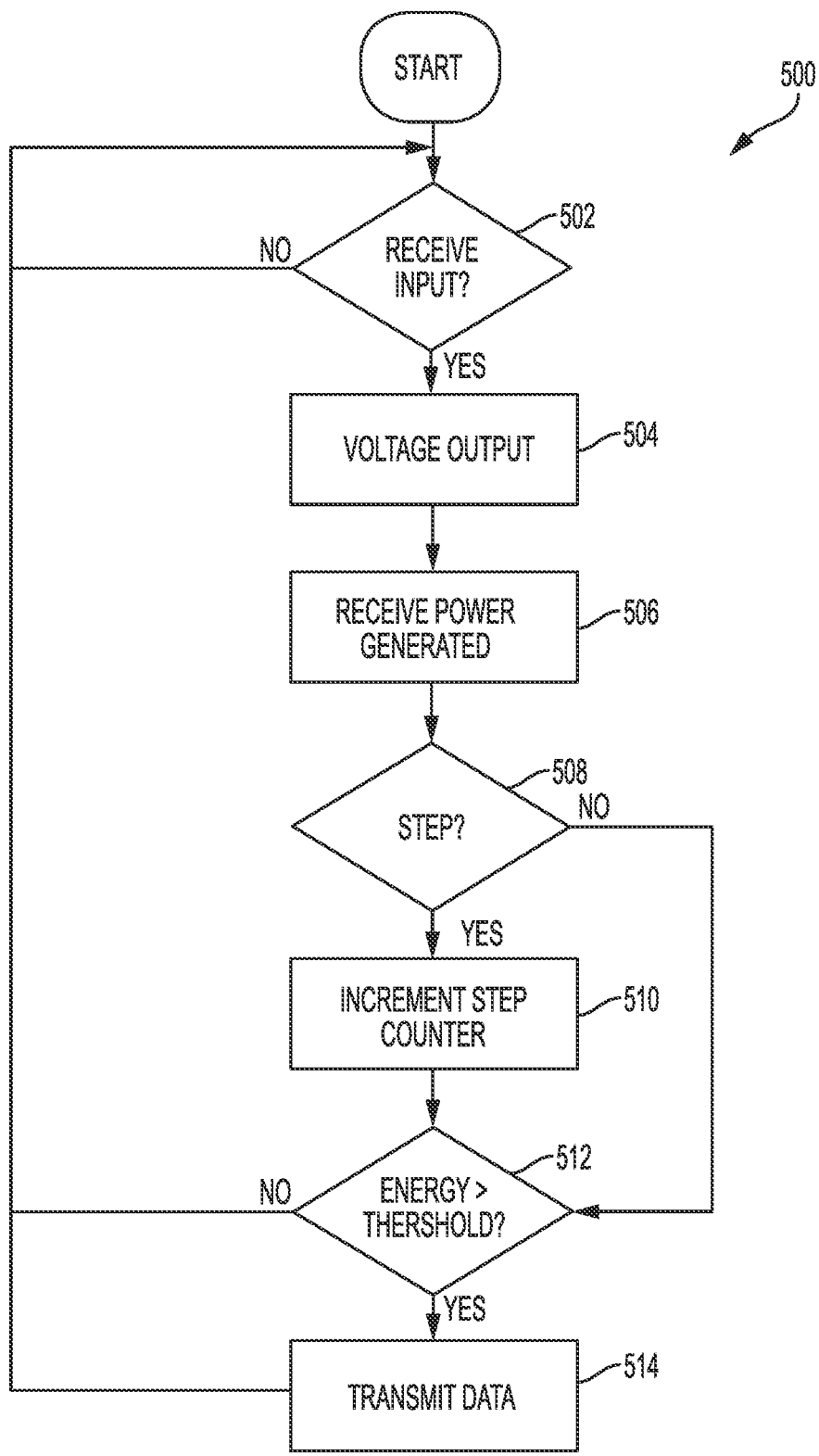
FIG. 5 is a flowchart for transmitting data from a wearable article as a user of the wearable article takes steps while wearing the wearable article, in an example embodiment.

FIG. 5 is a flowchart 500 for transmitting data from the wearable article 100 as a user of the wearable article 100 takes steps while wearing the wearable article 100, in an example embodiment. While the flowchart 500 is specifically described with respect to wearing the wearable article 100, it is to be understood that uses of wearing the wearable article 100 may be substituted for manual manipulation of the wearable article 100 to produce the same or similar effect. Moreover, a user is not necessarily a person but rather may be any animal or machine that may wear or otherwise manipulate the wearable article 100. Further, while the flowchart is described with respect to the piezoelectric generator 114, it is to be understood that principles described may apply to the kinetic energy generator block 202 in general and any other kinetic energy generator that may be utilized instead of or in addition to the piezoelectric generator 114.

At 502, the power management circuit 120 waits to receive an input from one or more piezoelectric generators 114.

At 504, the flexing of the piezoelectric generator 114 induces a voltage output 302 from the piezoelectric generator 114 that is received by the power management circuit 120. The voltage output 302 is commensurate with and related to the nature of the step, in that if the step is relatively fast then rise 308 and fall 312 may be relatively short while the peak 310 may be relatively high, while if the step is relatively slow then the rise 308 and fall 312 may be relatively long while the peak 310 may be relatively low.

At 506, the power management circuit 120 receives energy generated by the piezoelectric generator 114, based on the voltage and resultant current generated by flexing the piezoelectric generator 114. The power management circuit 120 optionally shifts a voltage or otherwise converts the energy received from the piezoelectric generator 114 and stores the energy in the output storage capacitor 124, including by adding the energy from the piezoelectric generator 114 to energy already stored in the output storage capacitor 124.

At 508, the controller 128 optionally determines if a step has occurred. The controller 128 may determine a step has occurred based, for instance, on the peak voltage 310 exceeding a predetermine threshold and/or according to any conditions that may tend to indicate that the energy generated by the piezoelectric generator 114 was from a footfall. Additionally or alternatively, sensor data from the sensor block 212, such as from an accelerometer, may supplement or replace an analysis of the energy generated by the piezoelectric generator in identifying a step.

At 510, if the controller 128 determines that a step has occurred then the controller 128 increments the step counter in the electronic data storage 130 and/or the electronic data storage block 208.

At 512, the controller 128 determines if the energy stored in the output storage capacitor 124 equals or exceeds the energy stored threshold 316. As illustrated, the determination of the amount of energy stored in the output storage capacitor 124 is based, at least in part, on receiving energy from the power management circuit 120. However, in various examples, the determination of the amount of energy stored in the output storage capacitor 124 may be continual, periodic, or otherwise occur not necessarily with respect to or dependent on a discrete occurrence of receiving or having received energy from the power management circuit 120. If the energy stored in the output storage capacitor 124 does not equal or exceed the energy stored threshold 316, the flowchart 500 returns to 502. If so, the threshold 316 is met the flowchart 500 proceeds to 514.

At 514, the controller 128 causes the wireless transceiver 126 to draw energy from the output storage capacitor 124 and transmit data from the electronic data storage 130 and/or the electronic data storage block 208. In various examples, the wireless transceiver 126 transmits all of the data stored in the electronic data storage 130 and/or electronic data storage block 208 with each burst. Alternatively, the controller selectively bursts data stored in the electronic data storage 130. In various examples, the wireless transceiver 126 transmits the data as an advertisement and without respect to any intended recipient of the data.

Figure 6A:
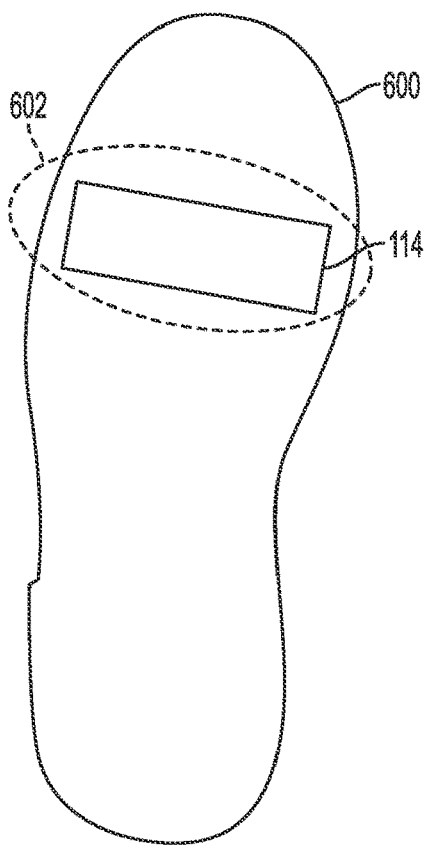
FIGS. 6A-6C are examples of layouts of piezoelectric generators with respect to a bottom contour of a wearable article, in example embodiments.
Figure 6B:
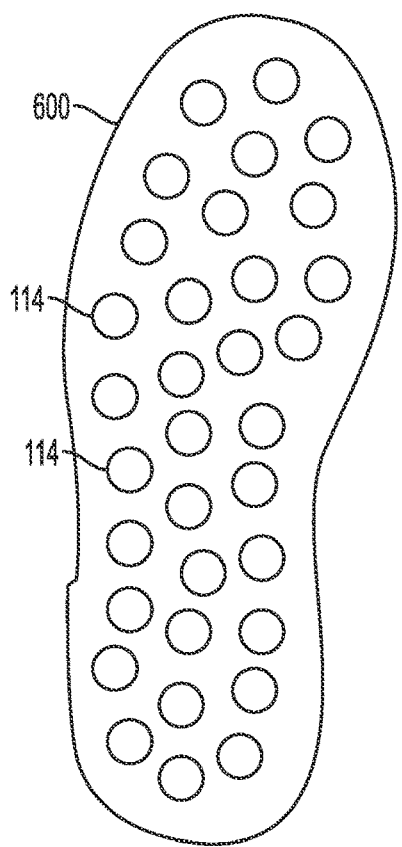
Figure 6C:
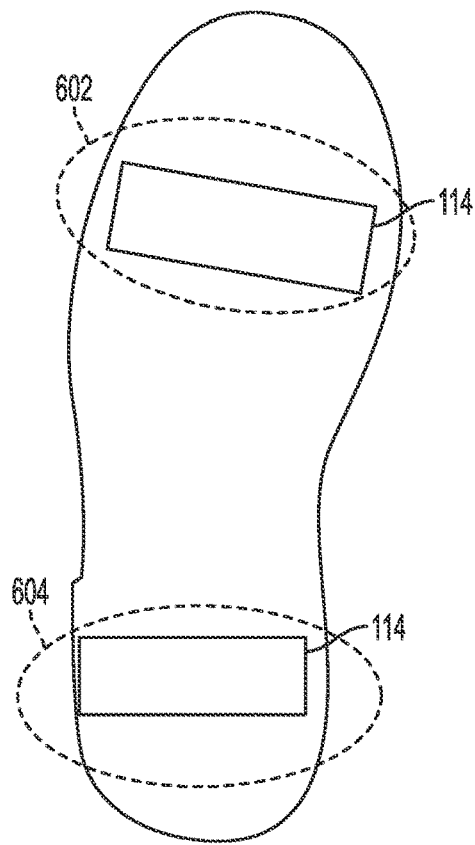

FIGS. 6A-6C are examples of layouts of piezoelectric generators 114 with respect to a bottom contour 600 of the wearable article 100, in example embodiments. The bottom contour 600 is presented for clarity and it is to be understood that the piezoelectric generators 114 will actually be disposed within the wearable article 100 in the manners disclosed herein, e.g., embedded within or between one or more of the outsole 104 and the insole 106.

In FIG. 6A, the piezoelectric generator 114 is positioned extending laterally across a forefoot region 602 of the wearable article 100, approximately where the ball of a human foot is seated when wearing the wearable article 100. The forefoot region 602 may tend to include, on average, the greatest amount of longitudinal flexing of any region of the wearable article 100 during a step or footfall. By extending the piezoelectric generator 114 laterally across the forefoot region 602, flexing of the piezoelectric generator 114 and, as a result, power generated by the piezoelectric generator 114, may be maximized relative to positioning the piezoelectric generator 114 in other locations on the wearable article 100.

FIG. 6B shows a configuration of multiple piezoelectric generators 114 that may be implemented instead of or in addition to the arrangement of the piezoelectric generator 114 in FIG. 6A. In particular, the piezoelectric generators 114 are dispersed generally over the bottom contour 600. In such an example, the resultant voltage output 302 may consist not necessarily of clear peaks 310 and rise 308 and fall times 312 but rather of a varying but relatively steady voltage over the course of a step.

FIG. 6C shows a configuration of two piezoelectric generators 114, one positioned at the front of the wearable article 100 in the forefoot region 602 and the other positioned at the back of the wearable article 100 in the heel region 604. This configuration may generate the voltage output 302 as received at the volatile energy storage block 204 illustrated in the graph 300, first by flexing the forefoot region 602 at the start of a step and actuating the piezoelectric generator 114 in the heel at the completion of the step. It is noted and emphasized that the voltage output 302 illustrated in the graph 300 may be generated from other configurations of piezoelectric generators 114, including by taking multiple steps in a wearable article 100 with only one piezoelectric generator 114 or multiple piezoelectric generators 114 that are not all necessarily actuated during a single step.

Figure 7:
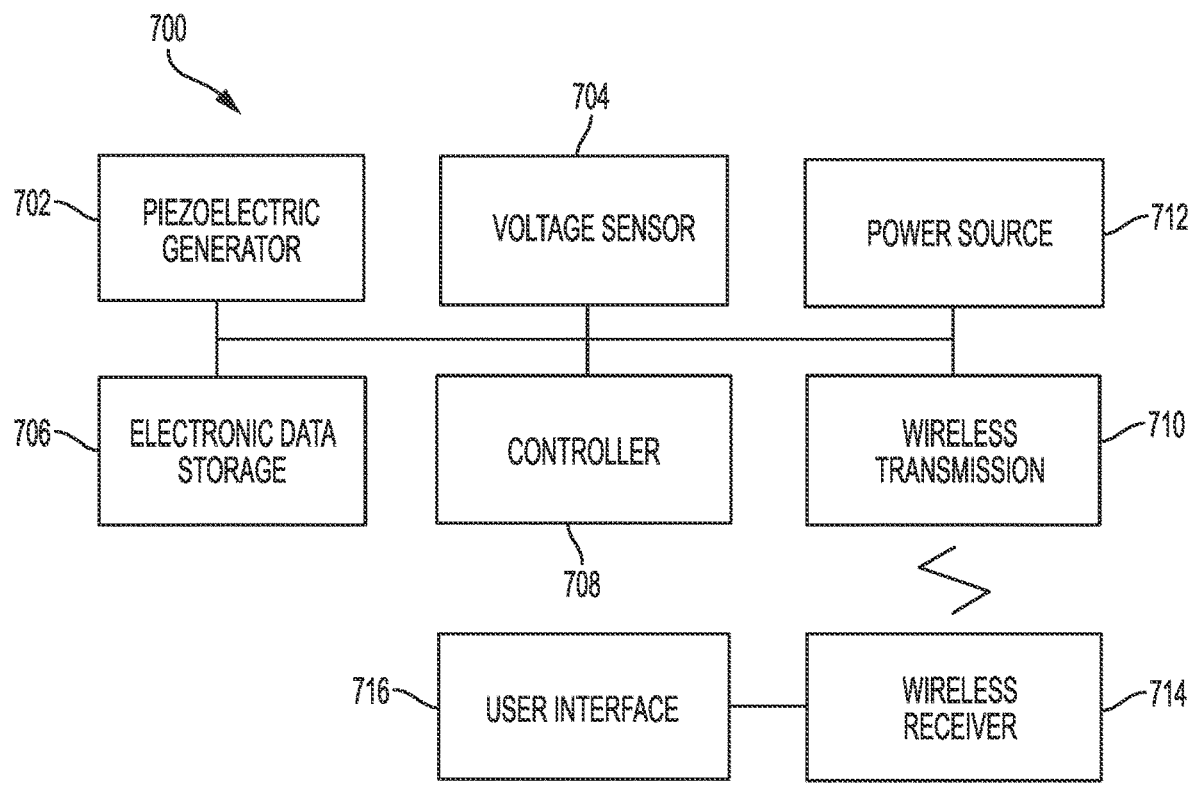
FIG. 7 is a block circuit diagram of a wearable article that is configured to determine and transmit data indicative of a physical status of the wearable article, in an example embodiment.

FIG. 7 is a block circuit diagram 700 of a wearable article 100 that is configured to determine and transmit data indicative of a physical status of the wearable article 100, in an example embodiment. The block circuit diagram 700 may be implemented with respect to the components illustrated with respect to FIGS. 1A and 1B along with additional components disclosed herein. Furthermore, certain components of the wearable article 100 may be omitted or not used to the extent that those components are not useful in the implementation of the block circuit diagram 700. In various examples, the wearable article 100 is an article of footwear, as disclosed herein, though any suitable wearable article may be utilized. Furthermore, while the components of the block circuit diagram are described with respect to being components of a particular wearable article 100 or article of footwear, it is to be understood that a system may include the various components not necessarily co-located on the same wearable article 100.

The example illustrated in the block circuit diagram 700 may be utilized in conjunction with and in the same wearable article 100 as other examples, such as the block circuit diagram 200. In such examples, components of the block circuit diagram 102 may correspond to blocks in both the block circuit diagrams 200 and 700. Thus, for instance, the piezoelectric generator 114 may both provide power to the volatile energy storage block 204 for use in a burst data advertisement as well as voltage to a voltage sensor in block diagram 700 for use in determining a change in the physical status of the wearable article 100. Moreover, particular components described with respect to the block circuit diagram 700 may be implemented in other examples of the wearable article 100, whether illustrated herein or not.

The block circuit diagram 700 includes piezoelectric generator 702, such as the piezoelectric generator 114. The piezoelectric generator 702 may be understood to be any suitable kinetic energy generator that is known or that may be developed that responds to a flexing of the wearable article and may be in any suitable orientation disclosed herein or that may provide information related to a physical status of the wearable article 100.

A voltage sensor 704 is coupled to the piezoelectric generator 114 and is configured to sense the voltage output 302 of the piezoelectric generator 114. The voltage sensor 704 generates a voltage sensor output that is indicative of the voltage as sensed. The voltage sensor is coupled to an electronic data storage block 706, such as the electronic data storage 130. The voltage sensor output may be stored as data in the electronic data storage block 706.

A controller block 708 optionally includes the controller 128 and other componentry that may distinguish between and among various outputs of the voltage sensor 704. The controller block 708 optionally includes the voltage sensor 704 and a comparator. The controller block 708 accesses voltage sensor outputs as stored in the electronic data storage block 706 and compares those voltage sensor outputs over time to determine a physical status of the wearable article 100, as disclosed herein. The controller block 708 may also manage any control function of the wearable article 100, including storing data to the electronic data storage block 706 and accessing data from the electronic data storage block 706.

A wireless transmission block 710 includes the wireless transceiver 126 and the antenna 118 and may be the same or incorporate similar functionality as the wireless transmission block 206. The controller block 708 may control the wireless transmission block 206 to transmit data indicative of the physical status of the wearable article 100.

The block circuit diagram 700 optionally further includes a power source 712, such as a battery. The power source 712 may not be included in various examples in which the piezoelectric generator 702 may supply the necessary power to operate the circuitry of the block circuit diagram 700, as disclosed herein with respect to the wearable article 100. However, in various examples, the power source 712 may variously supplement or replace the power provided by the piezoelectric generator 702. The power source 712 may be rechargeable, replaceable, or inaccessible for charging or replacement as known in the art.

The block diagram 700 optionally further includes components and devices that are external to the wearable article 100. In particular, a wireless receiver 714 may receive the wireless signals transmitted by the wireless transmission block 710. A user interface 716 may display or otherwise convey information indicative of the physical status of the wearable article 100 as received in the wireless transmission by the wireless receiver 714. The user interface 716 may include a visual display, a speaker, or other mechanism for providing the indication of the physical status of the wearable article as well as computing components as would be necessary to operate the user interface 716.

It is emphasized that the block diagram 700 illustrates components that may be utilized for the purposes of determining and transmitting data indicative of a physical status of the wearable article 100, in an example embodiment. The wearable article 100 may thus include not only the components of the block diagram 700 but also any additional components that are described herein in addition to those components illustrated in the block diagram 700. Thus, additional examples that are based on the block diagram 700 may incorporate components that may be used for data advertising and storage of electronic data, as disclosed herein, as well as additional features or functionality that may be useful under various circumstances.

Figure 8:
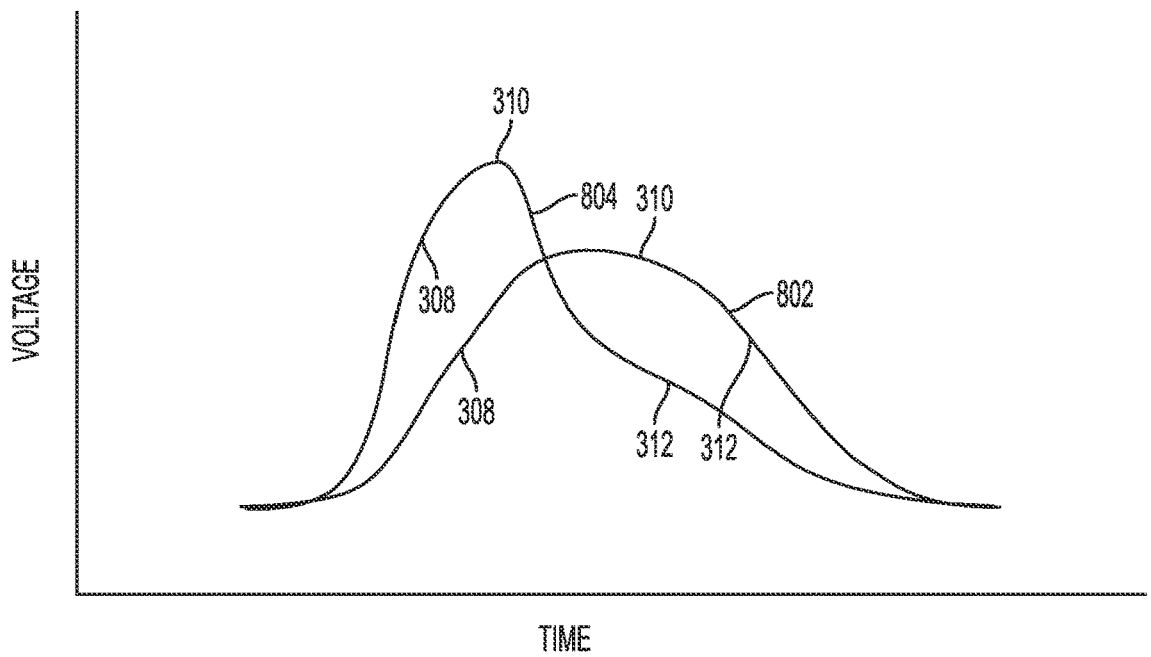
FIG. 8 is a voltage diagram illustrating a change in a voltage profile output of a piezoelectric generator over time, in an example embodiment.

FIG. 8 is a voltage diagram 800 illustrating a change in a voltage profile output of the piezoelectric generator 702 over time, in an example embodiment. The voltage diagram is illustrative and abstract and it is to be understood that the voltage profiles may have many different morphologies depending on the nature of the wearable article 100 and the way that individual wearers of the wearable article 100 use the wearable article 100. Thus, the way in which a wearer of the wearable article 100 walks or runs while wearing the wearable article 100 may change the morphology of the voltage profiles. However, it is to be understood that the principles illustrated with respect to the illustrative voltage profiles may be applied to any of a variety of voltage profiles and a variety of circumstances.

Further, while the voltage profiles are illustrated graphically for the purposes of this description, it is to be understood that the comparison of one voltage profile to another may be not on the basis of a full representation of a voltage profile to another but rather between and among discrete characteristics of the voltage profiles. Thus, as will be described herein, rather than necessarily comparing complete morphologies of voltage profiles, the controller block 708 may compare discrete characteristics of the voltage profiles, including peak, rise time, fall time, and overall duration of the profile, as disclosed herein.

The voltage diagram 800 includes a first voltage profile 802 obtained from the output of the piezoelectric generator 702 and converted into a sensor signal by the voltage sensor 704 at a first time. The voltage diagram 800 further includes a second voltage profile 804 obtained from the output of the piezoelectric generator 702 and converted into a sensor signal by the voltage sensor 704 at a second time later than the first time. In various examples, the first and second times are not discrete times but rather may represent an average or other statistical relationship of individual voltage profiles over a window or period of time. Thus, the first voltage profile 802 may represent an average of individual outputs from the piezoelectric generator 702 over a first window at or around the first time and the second voltage profile 804 may represent an average of individual outputs from the piezoelectric generator 702 over a second window at or around the second time.

For the purposes of the voltage diagram 800, time may be understood or accounted for in a variety of suitable manners. In an example, time may be absolute time measured in seconds, minutes, hours, days, and so forth. However, alternatively or additionally, time may be indicative not of absolute time but of events, such as steps of footfalls or outputs form the piezoelectric generator 702 that are interpretable as steps or footfalls, as disclosed herein. Thus, in an example, each voltage profile 802, 804 represents an average of voltage profiles over one thousand (1,000) steps or other suitable or appropriate window. Additionally, the time between the first and second times may, in various examples, be one week, one month, or other suitable amount of time, or may be a suitable number of steps, such as ten thousand (10,000) or one hundred thousand (100,000) steps or footfalls.

In general, the first voltage profile 802 corresponds to a time in which the wearable article 100 has experienced relatively little overall use while the second voltage profile 804 corresponds to a time in which the wearable article 100 has been worn down, at least to an extent, through use. In particular, as the wearable article 100 structurally deteriorates the support provided by the wearable article 100 to a wearer of the wearable article 100 may tend to decrease. Thus, initially the wearable article 100 may have greater stiffness and resistance to being flexed at the first time than at the second time. Because the wearable article 100 produces relatively less resistance to being flexed at the second time than at the first time, the rise time 308 and fall time 312 may tend to shorten while the peak voltage 310 may tend to increase. Thus, by measuring a change in one or more of the rise 308, peak 310, and fall 312 from the first voltage profile 802 to the second voltage profile 804, a physical condition of the wearable article 100 may be inferred.

In an example, the first time at which the first voltage profile 802 is taken is at or is shortly after the wearable article 100 is first used by a user. In an example, a window that accounts for the first time is the average of the first ten thousand (10,000) steps taken with the wearable article 100. Following that, a rolling window of ten thousand (10,000) steps may be utilized as the second time for the second voltage profile 804. The rolling window for the second time may be updated every ten thousand (10,000) steps, e.g., with each new step creating a new window of the ten thousand (10,000) immediately preceding steps, or may be considered for consecutive, non-overlapping ten thousand (10,000) step blocks, e.g., steps 100,000-109,999 would be one window, steps 110,000-119,999 would be another window, and so forth. It is emphasized that while ten thousand (10,000) steps are used as an example, any of a variety of steps or actual time may be utilized as appropriate or desired.

As described herein, the voltage profiles 802, 804 are generated based on the voltage sensor 704 producing a sensor output from the output of the piezoelectric generator 702. In an example, the sensor output is some or all of the rise time 308, the fall time 312, and the peak voltage 310 of a step or is discrete output voltages over time that may then be interpreted by the controller block 708 as pertaining to rise 308, peak 310, and fall 312 of a step. The voltage sensor 704 may variously transmit the sensor output to the controller block 708, which then saves rise 308, peak 310, and fall 312 to the electronic data storage block 706, or may save the sensor output directly to the electronic data storage block 706.

The controller block 708 may variously directly access the sensor output to obtain the second voltage profile 804 or access the electronic data storage block 706 to obtain the sensor output data as stored. Having generated the voltage profiles 802, 804, the controller block 708 then compares the first voltage profile 802 with the second voltage profile 804 to determine a change in some or all of the rise time 308, peak voltage 310, and fall time 312. Based on the comparison, the controller block 708 determines an indication of the physical status of the wearable article 100.

In an example, the indication of the physical status of the wearable article 100 is a recommended replacement of the wearable article 100. In such an example, the controller block 708 determines that the physical status of the wearable article 100 is such that the wearable article 100 has worn out or otherwise exceeded its suitable usable life and therefor replacement is recommended. The indication of the physical status may additionally or alternatively be a numerical indication of the deterioration or remaining useful life of the wearable article 100. For instance, the controller block 708 may determine a percentage of useful life remaining of the wearable article or an anticipated time until replacement based on the comparison of the first voltage profile 802 to the second voltage profile 804.

Additionally or alternatively, at least some of the function of the controller block 708 may be performed by a controller or processor external to the wearable article 100. In such an example, the controller block 708 may perform some of the operations needed to determine the physical status of the wearable article 100 and then transmit data to a relatively more powerful or capable processor or controller via the wireless transmission block 710 to generate the actual physical status. Thus, the controller block 708 may be understood to include computing or controlling resources In an example, the controller block 708 determines the indication of the physical status of the wearable article 10 based on a percentage change in one or more of the rise 308, peak 310, and fall 312 from the first voltage profile 802 to the second voltage profile 804. In an example, the percentage change is an increase in the peak voltage 310 of twenty-five (25) percent or more and a decrease in rise time 308 and fall time 312 of twenty-five percent (25) or more. It is noted and emphasized that the percentage change to indicate a recommended replacement of the wearable article 100 may be dependent on the nature of individual models and types of the wearable article 100. Thus, while certain types may allow for a relatively large loss of structural stability before replacement is necessarily recommended, it may be advisable to replace other types of wearable article 100 after relatively small amounts of structural deterioration. Thus, the percentages of increase or decrease in the voltage profiles 802, 804 that may result in a recommended replacement of the wearable article 100 may be directly dependent on the characteristics and expected uses of the particular wearable article 100 that is being assessed.

In an example, the controller block 708 provides an indication of the physical status of the wearable article 100 based on the data advertisement principles described with respect to the block circuit diagram 200 and the flowchart 500. In such an example, the data burst may include an indication of the physical status of the wearable article 100 along with other data. In such an example, a receive may detect the data burst and a computing system may read the indication of the physical status of the wearable article 100 and provide a visual or other indication of that physical status. In an example, a user interface coupled to the receiver and a processor may, based on the indication of the physical status, display a message that the wearable article 100 does not need to be replaced, is recommended to be replaced, or other data related to the physical status of the wearable article, such as an estimated time until replacement will be recommended or a percentage deterioration in the wearable article 100.

Additionally or alternatively, the indication of the physical status of the wearable article 100 may be transmitted to be presented on a user interface or otherwise communicated to a user according to any of a variety of mechanisms. For instance, the electronic data storage block 706 may include a removable data storage that may be removed and inserted in a reader. The wearable article 100 may incorporate a port, such as a USB port or other suitable mode of wired data transfer, that may be used to couple to an external system. Any of a variety of additional mechanisms may be utilized as appropriate to transfer the indication of the physical status of the wearable article 100. However, it is emphasized that in examples of the wearable article 100 where physical electronic isolation is desired, data transfer mechanisms that would expose the electronics to environmental conditions may be undesirable and wireless modes implemented instead.

Figure 9A:
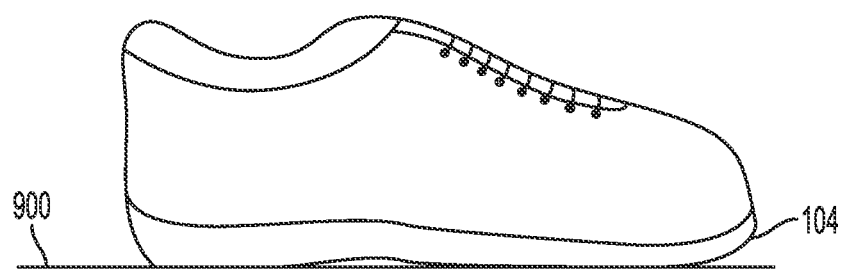
FIGS. 9A-9C depict an example of a wearable article flexing according to a conventional step or footfall, in an example embodiment.
Figure 9B:
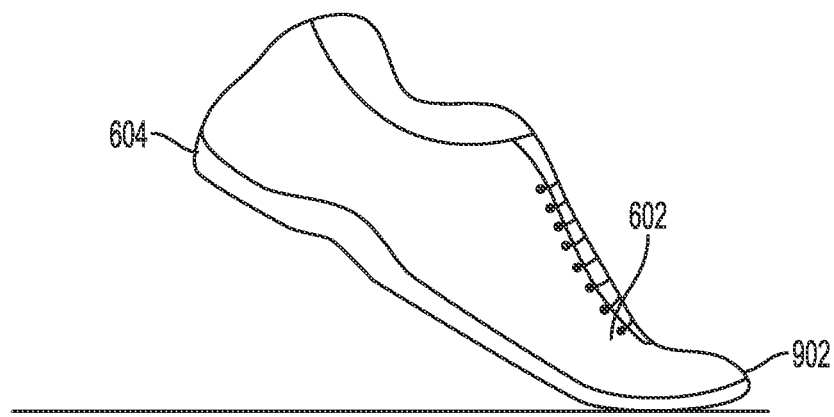
Figure 9C:
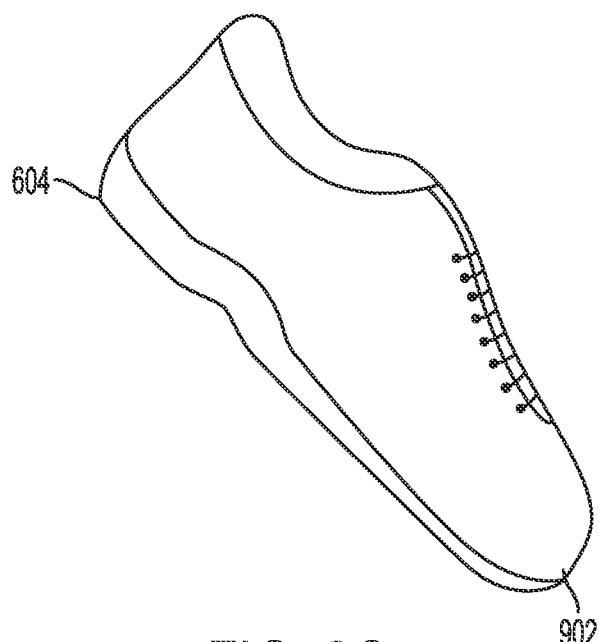

FIGS. 9A-9C depict an example of the wearable article 100 flexing according to a conventional step or footfall, in an example embodiment. The flexing illustrated is of the sort that may become relatively easier at the second time than at the first time owing to a change in the physical status of the wearable article 100. In FIG. 9A, the wearable article 100 starts with the outsole 104 flat on a surface 900. In FIG. 9B, in the initial action of a step, the heel region 604 rises as the wearable article 100 generally flexes in the forefoot region 602, leaving the toe box 902 generally against the surface 900 until the wearable article 100 lifts from the surface 900 entirely. The process of flexing the forefoot region 602 while the toe box 902 remains in contact with the surface 900 produces the rise 308 in the voltage profiles 802, 804, with the peak 310 generally occurring during this time.

In FIG. 9C, upon the toe box 902 leaving the surface 900, the wearable article 100 returns to an relaxed or unflexed state but not in contact with the surface 900. The returning to the relaxed state produces the fall 312 in the voltage profile 802, 804. The wearable article 100 eventually comes into contact with the surface 900 in the heel region 604 but flexing in that action may be limited to none.

Figure 10:
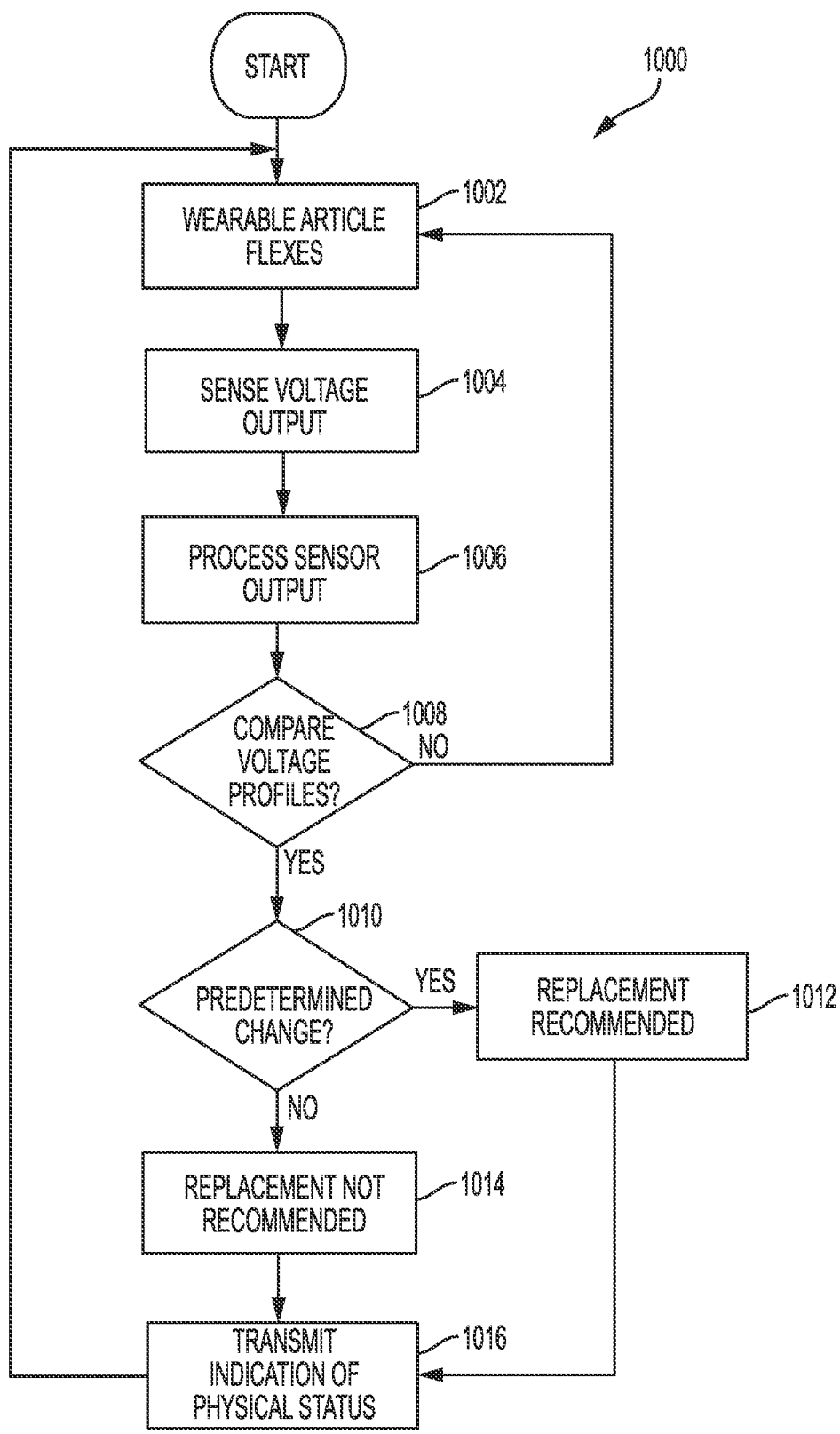
FIG. 10 is a flowchart for generating and transmitting an indication of a physical status of a wearable article, in an example embodiment.

FIG. 10 is a flowchart 1000 for generating and transmitting an indication of a physical status of the wearable article 100, in an example embodiment. The flowchart will be described with respect to the block diagram 700 but it is to be recognized and understood that the flowchart 1000 may be implemented on any suitable system on a wearable article 100, including other systems disclosed herein.

At 1002, the wearable article 100 flexes and induces a voltage from the piezoelectric generator 702.

At 1004, the voltage sensor 704 senses the output from the piezoelectric generator 702 and outputs a sensor output to the controller block 708.

At 1006, the controller block 708 processes the sensor output to produce a voltage profile e.g., as the first voltage profile 802 if the first voltage profile 802 has not yet been created or as the second voltage profile 804 if the second voltage profile has not been created, of the flexing. The voltage profile 802 includes one or more of the rise time 308, the peak voltage 310, and the fall time 312 and stores the voltage profile 802 in the electronic data storage block 706. Processing the sensor output to generate a voltage profile may be based on a single step by the wearable article 100 or may be based on multiple steps over a window, as disclosed herein. As such, processing the sensor output may be delayed until sufficient sensor outputs are received to produce the voltage profile 802, 804 over the prescribed window.

At 1008, the controller block 708 determines if conditions have been met to compare the first voltage profile 802 with the second voltage profile 804. Conditions for making the comparison are described herein and may be met with every identified step or flexing of the wearable article 100 or may be based on a predetermined number of steps having been taken since the last comparison, among other potential criteria for making the comparison. If the criteria are met then the flowchart 1000 proceeds to 1010. If the criteria are not met, the flowchart 1000 returns to waiting for the wearable article 100 to flex to induce the voltage from the piezoelectric generator 702.

At 1010, the controller block 708 compares at least one characteristic of the rise time 308, the peak voltage 310, and the fall time 312 from the first voltage profile 802 and the second voltage profile 804 to determine a percentage change in the one or more characteristics have changed by a predetermined amount. In an example, if any two of the characteristics 308, 310, 312 have changed by more than their respective predetermined amount, in the example herein by twenty-five (25) percent or more, then at 1012 the controller block 708 determines that physical status of the wearable article 100 is for a recommended replacement. If at least two of the characteristics 308, 310, 312 have not reached the predetermined amount of change then at 1014 the controller block 708 determines that the physical status of the wearable article 100 is that replacement is not recommended. In each case, the controller block 708 may store an indication of the physical status of the wearable article 100 in the electronic data storage block 706. The indication of the physical status of the wearable article 100 may default to being replacement not recommended at least until the first comparison between the first voltage profile 802 and the second voltage profile 804 can be made.

As has been noted herein, the details of determining a physical status of a given wearable article 100 may vary depending on the nature of the wearable article 100. In particular, the percentage change in the characteristics 308, 310, 312 and the number of characteristics 308, 310, 312 that need to exhibit the percentage change may vary depending on the wearable article. The percentage change needed to indicate recommended replacement may differ among the characteristics 308, 310, 312, and the physical status may be other than recommended replacement or replacement not recommended, as disclosed herein.

At 1016, the controller block 708 causes the wireless transmission block 710 to transmit an indication of the physical status of the wearable article 100. The controller block 708 may either transmit the indication of the physical status directly to the wireless transmission block 710 or may access the indication of the physical condition from the electronic data storage block 706. The wireless transmission may be according to a data advertising burst, as disclosed herein, or may be according to a prompt for the physical status from an outside transmitter or according to any other condition or command for transmitting the indication of the physical condition, whether originating from the wearable article 100 or from an outside system, as known in the art. Upon transmitting the indication of the physical condition, the flowchart 1000 returns to waiting for the wearable article to flex and induce an output from the piezoelectric generator 702 at 1002.

Figure 11:
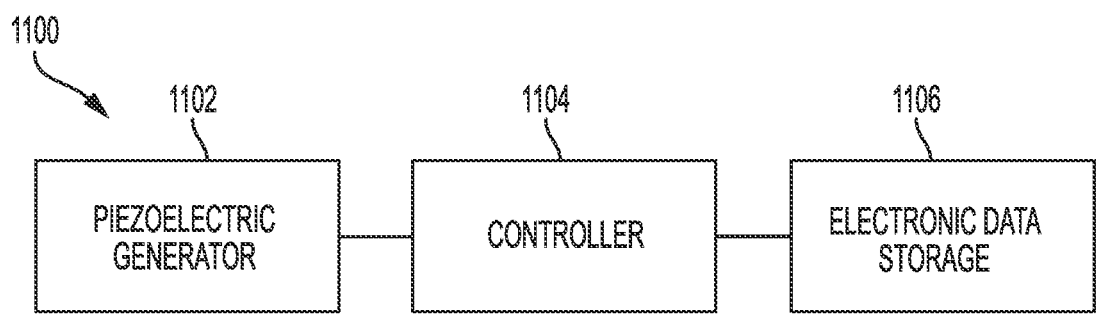
FIG. 11 block circuit diagram of a wearable article that is configured to allow for programming electronic data to the wearable article by flexing or otherwise manipulating the wearable article, in an example embodiment.

FIG. 11 block circuit diagram 1100 of an electrical system of the wearable article 100 that is configured to allow for programming electronic data to the wearable article 100 by flexing or otherwise manipulating the wearable article 100, in an example embodiment. Thus, in such an example embodiment, rather than using conventional wired or wireless electronic transfer of data to the wearable article 100, electronic data may be written by manipulating the wearable article 100 in such a way as to induce a voltage output from a piezoelectric generator 114 that may be interpreted as electronic data and stored in an electronic data storage 130. In various examples, the wearable article 100 is an article of footwear, as disclosed herein, though any suitable wearable article may be utilized.

A piezoelectric generator 1102 includes the piezoelectric generator 114 and optionally other componentry of the kinetic energy generator block 202 and the piezoelectric generator 1102. A controller block 1104 includes the controller 128 as well as optionally other components of the controller 210 and the controller block 1108. The controller block 1104 further includes or functions as a data translator. The data translator receives a voltage output form the piezoelectric generator 1102 and translates the voltage output to corresponding data. An electronic data storage block 1106 includes the electronic data storage 130 and receives and stores from the controller block 1104 data as translated from the voltage output of the piezoelectric generator 114.

As with the block diagrams 200 and 700, components of the block circuit diagram 102 that are not illustrated are not necessarily included in examples of the wearable article 100 that implement the block circuit diagram 1100. Such components may be included as appropriate and as desired but are not necessarily incorporated or required. Thus, for instance, the wireless transceiver 126 may be incorporated and utilized to transmit data stored in the electronic data storage block 1106, but is not necessarily included as desired. Further, components that are not detailed in the block diagrams 102, 200, 700, and 1100 may be included in implementations of any one or more of the block diagrams 102, 200, 700, and 1100 as appropriate and as desired.

Figure 12:
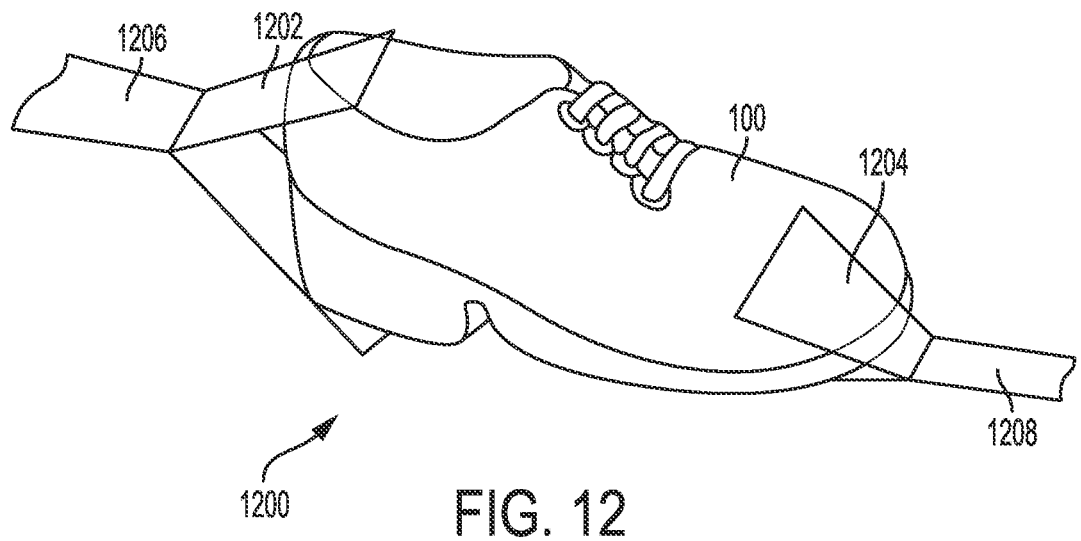
FIG. 12 is an illustration of an apparatus for mechanically manipulating a wearable article to store data in the electronic data storage block, in an example embodiment.

FIG. 12 is an illustration of an apparatus 1200 for mechanically manipulating the wearable article 100 to store data in the electronic data storage block 1106, in an example embodiment. Clamps 1202, 1204 grip the wearable article 100 on or near the toe box 902 and the heel region 604. Arms 1206, 1208 may then manipulate the wearable article 100 by bending and flexing the wearable article 100 rotationally about the forefoot region 602, as illustrated in FIGS. 6A-6C. The arms 1206, 1208 may be coupled to motors, servos, controllers, and the like that allow the arms 1206, 1208 to move in ways suitable to manipulate the wearable article 100 as desired, including rotationally.

The apparatus 1200 may control a speed and degree to which the wearable article 100 is flexed, thereby potentially changing the rise time 308, peak voltage 310, and fall time 312 of the voltage output 302. In various examples, the apparatus 1200 may also induce a torque in the wearable article 100 by twisting the wearable article 100 between the clamps 1202, 1204, thereby potentially inducing different voltage outputs from the piezoelectric generator 1102 than would necessarily be generated by flexing the wearable article about the forefoot region 602.

Figure 13:
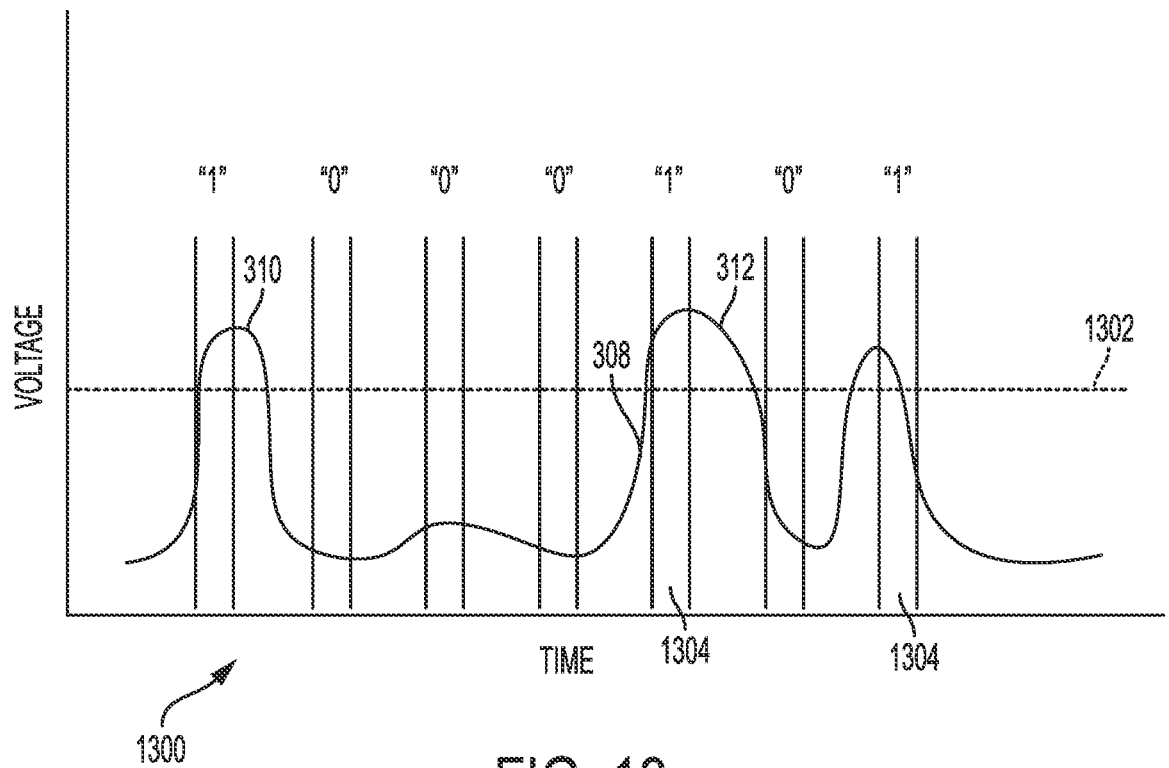
FIG. 13 is a voltage diagram illustrating the translation of voltage outputs from a piezoelectric generator into electronic data, in an example embodiment.

FIG. 13 is a voltage diagram 1300 illustrating the translation of voltage outputs from the piezoelectric generator 1102 into electronic data, in an example embodiment. The apparatus 1200 transmits data by flexing the wearable article 100 such that the peak voltage 310 does or does not exceed a peak voltage threshold 1302 at predetermined times or windows 1304. The data translator of the controller block 1104 may then translate the occurrence or non-occurrence of peak voltages 310 that exceed the threshold 1302 at the predetermined times 1304 as corresponding digital data. For instance, a peak voltage 310 that exceeds the peak voltage threshold 1302 at a predetermined time 1304 is interpreted as a logical "1" while not exceeding the threshold 1302 at a predetermined time 1304 is interpreted as a logical "0".

Additionally or alternatively, the windows 1304 may be dispensed with in favor of interpreting any peak voltages 310 that exceed a first threshold but not a second threshold higher than the first threshold as one logical bit, such as a logical "0", and any peak voltage 310 that exceeds both the first and second thresholds as a different logical bit, such as a logical "1". In such an example, data bits may be transmitted as quickly as the wearable article 100 can be manipulated to distinctly cause voltage peaks 100 at the desired voltage levels to distinguish between different logical bits and without requiring otherwise precise timing or adherence to prescribed windows 1304. However, such a mechanism may rely on relatively precise expectations of output voltage form the piezoelectric generator 1102.

While the voltage diagram 1300 illustrates a binary transmittal of individual bits of data, the apparatus 1200 may manipulate the wearable article 100 in such a way as to derive significance from multiple aspects of the voltage output 302, as noted above. Thus, for instance, the rise time 308 of a pulse may be compared against a threshold and, depending on the comparison, a logical "1" or a logical "0" may be translated from the rise time 308. The same principles may be applied to obtain data from the fall time 312 or any other measurable aspect of a pulse. Thus, multiple bits may be translated from a single pulse. In such an example, the rise time 308 may account for a first bit of a group of three bits, the peak voltage 310 may account for a second bit of the group of three bits, and the fall time 312 may account for a third bit of the group of three bits. Thus, in an example, if the rise time 308 is faster than a rise time threshold for a logical "1", the peak voltage 310 exceeds the peak voltage threshold 1302 for a logical "1", and the fall time 312 is not faster than a fall time threshold for a logical "0", then that pulse may correspond to the logical output "110" that may be translated by the controller block 1104 and stored in the electronic data storage block 1106.

The controller block 1104 may assess different piezoelectric generators 114 for electronic data. Thus, while a first piezoelectric generator 114 may be positioned in or near the forefoot region 602, a second piezoelectric generator 114 may be positioned along the bottom contour 600 in such a way as to be sensitive to a torque on the wearable article 100, as described above. Thus, in the illustrative example, the wearable article 100 may be flexed and torqued to separately manipulate each of the piezoelectric generators 114 to impart data that may be translated by the controller block 1104.

Moreover, while the block circuit diagram 1100 is described with respect to piezoelectric generators 114 and the piezoelectric generator block 1102, it is to be understood that the principles described may be applicable to any of a variety of kinetic energy generators. The manipulation of the wearable article may be adjusted according to the nature of the specific kinetic energy generator used. Such additional kinetic energy generators may be used alone or in conjunction with piezoelectric generators 114. Thus, the apparatus 1200 may be configured both to flex the wearable article 100 and to shake or otherwise move the wearable article to stimulate a kinematic generator.

In an example, the controller block 1104 may write data to the electronic data storage block 1106 upon detecting a code made of up of a predetermined sequence of voltage outputs form the piezoelectric generator 1102. As such, the predetermined sequence may be generated by manipulating the wearable article 100 in a predetermined way in order to prevent or lessen the likelihood of an inadvertent writing of data to the electronic data storage block 1106. Thus, to initiate writing of data to the electronic data storage block 1106 the code may first be imparted, following which the data may be written.

Figure 14:
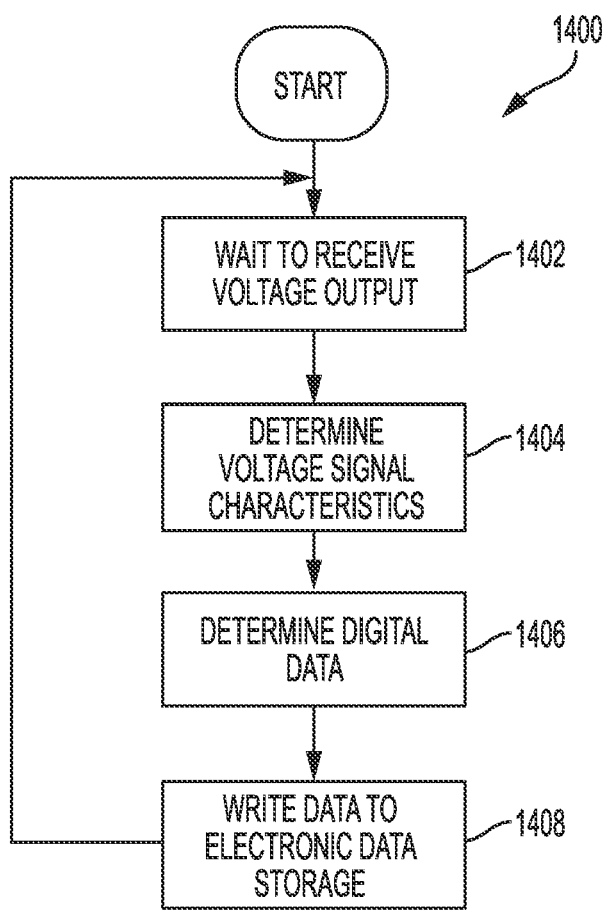
FIG. 14 is a flowchart for imparting electronic data to a wearable article by mechanically manipulating the wearable article, in an example embodiment.

FIG. 14 is a flowchart 1400 for imparting electronic data to a wearable article 100 by mechanically manipulating the wearable article 100, in an example embodiment. While the flowchart 1400 is described with respect to the block diagram 1100, it is to be understood that the flowchart 1400 may be implemented on or with respect to any suitable wearable article 100 or system.

At 1402, the controller block 1104 waits until a predetermined time, such as a window 1304, to receive a voltage output from the piezoelectric generator 1102 occurs.

At 1404, upon the predetermined time being arrived at, the controller block 1104 determines one or more characteristics of any voltage output 302 that occurs at the predetermined time. The determination may be based on a measurement of the voltage output 302 relating to each particular characteristic. The characteristics may include one or more of the rise time 308, the peak voltage 310, and the fall time 312.

At 1406, the controller block 1106 determines digital data that corresponds to the one or more characteristics, as determined. In an example, each characteristic corresponds to one digital bit. In such an example, the nature of the characteristic as determined dictates the determination of the value of the digital bit, as disclosed herein.

At 1408, the controller block 1106 causes the digital data from the voltage output 302 to be written to the electronic data storage block 1106. The flowchart 1400 then returns to 1402.

EXAMPLES

In Example 1, a wearable article includes a structural material configured to enable the wearable article to the worn on a body, a volatile energy storage device, a wireless transmission circuit, coupled to the volatile energy storage device, comprising an antenna having a minimum transmission energy, a kinetic energy generator, positioned with respect to the structural material in a configuration to be manipulated to induce a voltage output, the kinetic energy generator coupled to and configured to charge the volatile energy storage device, a sensor configured to output activity data related to the wearable article, and an electronic data storage, coupled to the sensor, configured to store the activity data, wherein, upon the volatile energy storage device charging to at least the minimum transmission energy, the wireless transmission circuit transmits the activity data as stored in the electronic data storage based on energy discharged, at least in part, from the volatile energy storage device.

In Example 2, the wearable article of Example 1 optionally further includes that the kinetic energy generator is a piezoelectric generator.

In Example 3, the wearable article of any one or more of Examples 1 and 2 optionally further includes a sole, wherein the piezoelectric generator is positioned, at least in part, in relation to the sole.

In Example 4, the wearable article of any one or more of Examples 1-3 optionally further includes that the piezoelectric generator is positioned within the sole.

In Example 5, the wearable article of any one or more of Examples 1-4 optionally further includes that the sole comprises an insole and an outsole and wherein the piezoelectric generator is positioned on a top surface of the sole outsole and a bottom surface of the insole.

In Example 6, the wearable article of any one or more of Examples 1-5 optionally further includes that the piezoelectric generator comprises a plurality of piezoelectric generators and wherein the plurality of piezoelectric generators are positioned in discrete and separate locations in the wearable article.

In Example 7, the wearable article of any one or more of Examples 1-6 optionally further includes that a first piezoelectric generator of the plurality of piezoelectric generators is positioned proximate a forefoot of the wearable article and wherein the second piezoelectric generator of the plurality of piezoelectric generators is positioned proximate a heel of the wearable article.

In Example 8, the wearable article of any one or more of Examples 1-7 optionally further includes a sole, wherein the plurality of piezoelectric generators are distributed substantially evenly with respect to the sole.

In Example 9, the wearable article of any one or more of Examples 1-8 optionally further includes a sole having a major surface, wherein the piezoelectric generator is substantially coextensive to and conformal with the major surface of the sole.

In Example 10, the wearable article of any one or more of Examples 1-9 optionally further includes that the piezoelectric generator is configure to generate a discrete energy output less than the minimum transmission energy upon a discrete flexing of the piezoelectric generator, and wherein the energy storage device is configured to charge to at least the minimum transmission energy upon a plurality of discrete flexing events of the piezoelectric generator.

In Example 11, the wearable article of any one or more of Examples 1-10 optionally further includes that the volatile energy storage device is a capacitor.

In Example 12, the wearable article of any one or more of Examples 1-11 optionally further includes a controller configured to cause the wireless transmission circuit to transmit the activity data based, at least in part, on receiving an indication that the volatile energy transmission device has a charge of at least the minimum transmission energy.

In Example 13, the wearable article of any one or more of Examples 1-12 optionally further includes that the electronic data storage is further configured to store identity data of the wearable article and wherein the wireless transmission circuit is further configured to transmit the identity data upon the volatile energy storage device charging to at least the minimum transmission energy.

In Example 14, the wearable article of any one or more of Examples 1-13 optionally further includes that the wearable article is an article of footwear, the sensor is configured to sense a footstep and wherein the activity data is indicative, at least in part, of a number of footsteps for which the article of footwear was worn.

In Example 15, a method includes outputting, with a kinetic energy generator positioned with respect to a structural material of an article of footwear in a configuration to be manipulated with a manipulation of the article of footwear, a voltage output, the kinetic energy generator coupled to and configured to charge a volatile energy storage device, outputting, with a sensor, activity data related to the article of footwear, storing, in an electronic data storage, coupled to the sensor, the activity data, and transmitting, with a wireless transmission circuit, upon the volatile energy storage device charging to at least the minimum transmission energy, the activity data as stored in the electronic data storage based on energy discharged, at least in part, from the volatile energy storage device.

In Example 16, the method of Example 15 optionally further includes that the kinetic energy generator is a piezoelectric generator.

In Example 17, the method of any one or more of Examples 15 and 16 optionally further includes that the piezoelectric generator is positioned, at least in part, in relation to the sole.

In Example 18, the method of any one or more of Examples 15-17 optionally further includes that the piezoelectric generator is positioned within the sole.

In Example 19, the method of any one or more of Examples 15-18 optionally further includes that the sole comprises an insole and an outsole and wherein the piezoelectric generator is positioned on a top surface of the sole outsole and a bottom surface of the insole.

In Example 20, the method of any one or more of Examples 15-19 optionally further includes that the piezoelectric generator comprises a plurality of piezoelectric generators, wherein the plurality of piezoelectric generators are positioned in discrete and separate locations in the article of footwear, and wherein outputting a voltage output is from at least one of the plurality of piezoelectric generators.

In Example 21, the method of any one or more of Examples 15-20 optionally further includes that a first piezoelectric generator of the plurality of piezoelectric generators is positioned proximate a forefoot of the wearable article and wherein the second piezoelectric generator of the plurality of piezoelectric generators is positioned proximate a heel of the article of footwear.

In Example 22, the method of any one or more of Examples 15-21 optionally further includes a sole, wherein the plurality of piezoelectric generators are distributed substantially evenly with respect to the sole.

In Example 23, the method of any one or more of Examples 15-22 optionally further includes a sole having a major surface, wherein the piezoelectric generator is substantially coextensive to and conformal with the major surface of the sole.

In Example 24, the method of any one or more of Examples 15-23 optionally further includes that the piezoelectric generator is configure to generate a discrete energy output less than the minimum transmission energy upon a discrete flexing of the piezoelectric generator, and wherein the energy storage device is configured to charge to at least the minimum transmission energy upon a plurality of discrete flexing events of the piezoelectric generator.

In Example 25, the method of any one or more of Examples 15-24 optionally further includes that the volatile energy storage device is a capacitor.

In Example 26, the method of any one or more of Examples 15-25 optionally further includes causing, with a controller, the wireless transmission circuit to transmit the activity data based, at least in part, on receiving an indication that the volatile energy transmission device has a charge of at least the minimum transmission energy.

In Example 27, the method of any one or more of Examples 15-26 optionally further includes that the electronic data storage is further configured to store identity data of the article of footwear and further comprising transmitting, with the wireless transmission circuit, the identity data upon the volatile energy storage device charging to at least the minimum transmission energy.

In Example 28, the method of any one or more of Examples 15-27 optionally further includes that the sensor is configured to sense a footstep and wherein the activity data is indicative, at least in part, of a number of footsteps for which the article of footwear was worn.

In Example 29, an article of footwear includes a structural material configured to enable the article of footwear to the worn on a body, a wireless transmission circuit, a piezoelectric generator, positioned with respect to the structural material in a configuration to be flexed to induce a voltage signal output, configured to output a signal having a voltage profile upon being flexed, a voltage sensor, coupled to the piezoelectric generator, configured to sense the voltage profile and output a sensor signal indicative of the voltage profile, an electronic data storage, coupled to the voltage sensor, configured to store voltage profile information based on the sensor data, a comparator, coupled to the electronic data storage, configured to identify a change in the voltage profile information over time, wherein the wireless transmission circuit is configured to transmit data indicative of a physical status of the article of footwear based on the change in the voltage profile information over time.

In Example 30, the article of footwear of Example 29 optionally further includes that the voltage profile includes a peak voltage, relative to a baseline voltage, of a pulse, a rise time of the pulse, a fall time of the pulse, and a pulse duration, and wherein the change in the voltage profile is based on a change in the voltage profile of at least one of the peak voltage, the rise time, the fall time, and the pulse duration.

In Example 31, the article of footwear of any one or more of Examples 29 and 30 optionally further includes that the data indicative of the physical status indicates a recommended replacement of the article of footwear upon the peak voltage increasing by a predetermined amount.

In Example 32, the article of footwear of any one or more of Examples 29-31 optionally further includes that the data indicative of the physical status indicates a recommended replacement of the article of footwear upon at least one of the rise time, the fall time, and the pulse duration decreasing by a predetermined amount.

In Example 33, the article of footwear of any one or more of Examples 29-32 optionally further includes that the rise time is based on a time for the voltage profile to rise between a predetermined baseline percentage from the baseline and a predetermined peak percentage from the peak voltage, wherein the fall time is based on a time for the voltage profile to fall between the predetermined peak percentage and the predetermined baseline percentage, and wherein the pulse duration is based on a time for the voltage profile to pass between a first crossing of the predetermined baseline percentage and a second crossing of the predetermined baseline percentage.

In Example 34, the article of footwear of any one or more of Examples 29-33 optionally further includes a controller configured to determine the change in the voltage profile based on a comparison of a first voltage profile sensed at a first time as stored in the electronic data storage and a second voltage profile sensed at a second time later than the first time.

In Example 35, the article of footwear of any one or more of Examples 29-34 optionally further includes that the first time is based on a first time window and the first voltage profile is an average of voltage profiles sensed during the first time window and wherein the second time is based on a second time window and the second voltage profile is an average of voltage profiles sensed during the second time window.

In Example 36, the article of footwear of any one or more of Examples 29-35 optionally further includes that the second time window is a moving time window and wherein the second voltage profile is based on an average of voltage profiles during the moving time window include a most recently sensed voltage profile.

In Example 37, the article of footwear of any one or more of Examples 29-36 optionally further includes that the controller is further configured to cause, at least in part, a user interface to provide a message based on the data indicative of the physical status.

In Example 38, a method of making an article of footwear includes forming a structural material configured to enable the article of footwear to the worn on a body, positioning a piezoelectric generator with respect to the structural material in a configuration to be flexed to induce a voltage signal output, configured to output a signal having a voltage profile upon being flexed, and coupling a wireless transmission circuit, a voltage sensor, an electronic data storage, and a comparator to the piezoelectric generator, wherein the voltage sensor configured to sense the voltage profile and output a sensor signal indicative of the voltage profile, wherein the electronic data storage is configured to store voltage profile information based on the sensor data, wherein the comparator is configured to identify a change in the voltage profile information over time, and wherein the wireless transmission circuit is configured to transmit data indicative of a physical status of the article of footwear based on the change in the voltage profile information over time.

In Example 39, the method of Example 38 optionally further includes that the voltage profile includes a peak voltage, relative to a baseline voltage, of a pulse, a rise time of the pulse, a fall time of the pulse, and a pulse duration, and wherein the change in the voltage profile is based on a change in the voltage profile of at least one of the peak voltage, the rise time, the fall time, and the pulse duration.

In Example 40, the method of Examples 38 and 39 optionally further includes that the data indicative of the physical status indicates a recommended replacement of the article of footwear upon the peak voltage increasing by a predetermined amount.

In Example 41, the method of Examples 38-40 optionally further includes that the data indicative of the physical status indicates a recommended replacement of the article of footwear upon at least one of the rise time, the fall time, and the pulse duration decreasing by a predetermined amount.

In Example 42, the method of Examples 38-41 optionally further includes that the rise time is based on a time for the voltage profile to rise between a predetermined baseline percentage from the baseline and a predetermined peak percentage from the peak voltage, wherein the fall time is based on a time for the voltage profile to fall between the predetermined peak percentage and the predetermined baseline percentage, and wherein the pulse duration is based on a time for the voltage profile to pass between a first crossing of the predetermined baseline percentage and a second crossing of the predetermined baseline percentage.

In Example 43, the method of Examples 38-42 optionally further includes coupling a controller to the voltage sensor and the electronic data storage, the controller configured to determine the change in the voltage profile based on a comparison of a first voltage profile sensed at a first time as stored in the electronic data storage and a second voltage profile sensed at a second time later than the first time.

In Example 44, the method of Examples 38-43 optionally further includes the first time is based on a first time window and the first voltage profile is an average of voltage profiles sensed during the first time window and wherein the second time is based on a second time window and the second voltage profile is an average of voltage profiles sensed during the second time window.

In Example 45, the method of Examples 38-44 optionally further includes that the second time window is a moving time window and wherein the second voltage profile is based on an average of voltage profiles during the moving time window include a most recently sensed voltage profile.

In Example 46, the method of Examples 38-45 optionally further includes that the controller is further configured to cause, at least in part, a user interface to provide a message based on the data indicative of the physical status.

In Example 47, a wearable article includes a structural material configured to enable the wearable article to the worn on a body, a piezoelectric generator, positioned with respect to the structural material in a configuration to be flexed to output a voltage, a data translator, coupled to the piezoelectric generator, configured to output electronic data based on the voltage, and an electronic data storage, coupled to the data translator, configured to store the electronic data from the data translator.

In Example 48, the wearable article of Example 47 optionally further includes that the data translator is configured to generate digital electronic data based on the voltage relative to a voltage threshold at predetermined times.

In Example 49, the wearable article of any one or of Examples 47 and 48 optionally further includes that the voltage corresponds to a first binary digit when the voltage exceeds the voltage threshold and corresponds to a second binary digit, different than the first binary digit, when the voltage is less than the voltage threshold.

In Example 50, the wearable article of any one or of Examples 47-49 optionally further includes that the voltage includes a peak voltage, relative to a baseline voltage, of a pulse, a rise time of the pulse, a fall time of the pulse, and a pulse duration, and wherein the change in the voltage profile is based on a change in the voltage profile of at least one of the peak voltage, the rise time, the fall time, and the pulse duration, and wherein the data translator generates digital data bits based on at least one of the peak voltage, the rise time, the fall time, and the pulse duration of a pulse.

In Example 51, the wearable article of any one or of Examples 47-50 optionally further includes that the data translator is configured to generate multiple digital data bits based on at least two of the peak voltage, the rise time, the fall time, and the pulse duration of a single pulse.

In Example 52, the wearable article of any one or of Examples 47-51 optionally further includes that the data translator is configured to output the electronic data based on the voltage as sensed during the predetermined windows.

In Example 53, the wearable article of any one or of Examples 47-52 optionally further includes that the data translator is configured to output digital electronic data based on the voltage as sensed relative to a voltage threshold during the predetermined window.

In Example 54, the wearable article of any one or of Examples 47-53 optionally further includes that the data translator is configured to output a first digital bit based on the voltage as sensed exceeding the voltage threshold during one of the predetermined windows and a second digital bit different than the first digital bit based on the voltage as sensed not exceeding the voltage threshold during the one of the predetermined windows.

In Example 55, the wearable article of any one or of Examples 47-54 optionally further includes a controller configured to selectively cause the electronic data to be written to the electronic data storage.

In Example 56, the wearable article of any one or of Examples 47-55 optionally further includes that the controller is configured to selectively cause the electronic data to be written to the electronic data storage based on the a write command being included in the electronic data.

In Example 57, the wearable article of any one or of Examples 47-56 optionally further includes that the wearable article is configured be seated in an apparatus configured to flex the wearable article to impart the electronic data to the wearable article.

In Example 58, a method for making a wearable article includes forming a structural material to enable the wearable article to the worn on a body, positioning a piezoelectric generator with respect to the structural material in a configuration to be flexed to output a voltage, coupling a data translator to the piezoelectric generator, the data translator configured to output electronic data based on the voltage, and coupling an electronic data storage to the data translator, the electronic data storage configured to store the electronic data from the data translator.

In Example 59, the method of Example 58 further optionally includes that the data translator is configured to generate digital electronic data based on the voltage relative to a voltage threshold at predetermined times.

In Example 60, the method of any one or more of Examples 58 and 59 optionally further includes that the voltage corresponds to a first binary digit when the voltage exceeds the voltage threshold and corresponds to a second binary digit, different than the first binary digit, when the voltage is less than the voltage threshold.

In Example 61, the method of any one or more of Examples 58-60 optionally further includes that the voltage includes a peak voltage, relative to a baseline voltage, of a pulse, a rise time of the pulse, a fall time of the pulse, and a pulse duration, and wherein the change in the voltage profile is based on a change in the voltage profile of at least one of the peak voltage, the rise time, the fall time, and the pulse duration, and wherein the data translator generates digital data bits based on at least one of the peak voltage, the rise time, the fall time, and the pulse duration of a pulse.

In Example 62, the method of any one or more of Examples 58-61 optionally further includes that the data translator is configured to generate multiple digital data bits based on at least two of the peak voltage, the rise time, the fall time, and the pulse duration of a single pulse.

In Example 63, the method of any one or more of Examples 58-62 optionally further includes that the data translator is configured to output the electronic data based on the voltage as sensed during the predetermined windows.

In Example 64, the method of any one or more of Examples 58-63 optionally further includes that the data translator is configured to output digital electronic data based on the voltage as sensed relative to a voltage threshold during the predetermined window.

In Example 65, the method of any one or more of Examples 58-64 optionally further includes that the data translator is configured to output a first digital bit based on the voltage as sensed exceeding the voltage threshold during one of the predetermined windows and a second digital bit different than the first digital bit based on the voltage as sensed not exceeding the voltage threshold during the one of the predetermined windows.

In Example 66, the method of any one or more of Examples 58-65 optionally further includes coupling a controller to the data translator and the electronic data storage, the controller configured to selectively cause the electronic data to be written to the electronic data storage.

In Example 67, the method of any one or more of Examples 58-66 optionally further includes that the controller is configured to selectively cause the electronic data to be written to the electronic data storage based on the a write command being included in the electronic data.

In Example 68, the method of any one or more of Examples 58-67 optionally further includes that the wearable article is configured be seated in an apparatus configured to flex the wearable article to impart the electronic data to the wearable article.

In Example 69, a method includes flexing a wearable article according to a predetermined pattern corresponding to electronic data, the wearable article comprising a piezoelectric generator, wherein flexing the wearable article causes the piezoelectric generator to flex, wherein flexing the wearable article causes the piezoelectric generator to output a voltage, wherein a data translator, coupled to the piezoelectric generator, outputs electronic data based on the voltage, and wherein an electronic data storage stores the electronic data from the data translator.

In Example 70, a system includes a structural material configured to enable a wearable article to the worn on a body, a wireless transmission circuit, a piezoelectric generator, positioned with respect to the structural material in a configuration to be flexed to induce a voltage signal output, configured to output a signal having a voltage profile upon being flexed, a voltage sensor, coupled to the piezoelectric generator, configured to sense the voltage profile and output a sensor signal indicative of the voltage profile, an electronic data storage, coupled to the voltage sensor, configured to store voltage profile information based on the sensor data, a comparator, coupled to the electronic data storage, configured to identify a change in the voltage profile information over time, wherein the wireless transmission circuit is configured to transmit data indicative of a physical status of the wearable article based on the change in the voltage profile information over time.

In Example 71, the system of Example 70 optionally further includes that the voltage profile includes a peak voltage, relative to a baseline voltage, of a pulse, a rise time of the pulse, a fall time of the pulse, and a pulse duration, and wherein the change in the voltage profile is based on a change in the voltage profile of at least one of the peak voltage, the rise time, the fall time, and the pulse duration.

In Example 72, the system of any one or more of Examples 70 and 71 optionally further includes that the data indicative of the physical status indicates a recommended replacement of the wearable article upon the peak voltage increasing by a predetermined amount.

In Example 73, the system of any one or more of Examples 70-72 optionally further includes that the data indicative of the physical status indicates a recommended replacement of the wearable article upon at least one of the rise time, the fall time, and the pulse duration decreasing by a predetermined amount.

In Example 74, the system of any one or more of Examples 70-73 optionally further includes that the rise time is based on a time for the voltage profile to rise between a predetermined baseline percentage from the baseline and a predetermined peak percentage from the peak voltage, wherein the fall time is based on a time for the voltage profile to fall between the predetermined peak percentage and the predetermined baseline percentage, and wherein the pulse duration is based on a time for the voltage profile to pass between a first crossing of the predetermined baseline percentage and a second crossing of the predetermined baseline percentage.

In Example 75, the system of any one or more of Examples 70-74 optionally further includes a controller configured to determine the change in the voltage profile based on a comparison of a first voltage profile sensed at a first time as stored in the electronic data storage and a second voltage profile sensed at a second time later than the first time.

In Example 76, the system of any one or more of Examples 70-75 optionally further includes that the first time is based on a first time window and the first voltage profile is an average of voltage profiles sensed during the first time window and wherein the second time is based on a second time window and the second voltage profile is an average of voltage profiles sensed during the second time window.

In Example 77, the system of any one or more of Examples 70-76 optionally further includes that the second time window is a moving time window and wherein the second voltage profile is based on an average of voltage profiles during the moving time window include a most recently sensed voltage profile.

In Example 78, the system of any one or more of Examples 70-77 optionally further includes that the controller is further configured to cause, at least in part, a user interface to provide a message based on the data indicative of the physical status.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Certain embodiments are described herein as including logic or a number of components, modules, or mechanisms. Modules may constitute either software modules (e.g., code embodied on a machine-readable medium or in a transmission signal) or hardware modules. A "hardware module" is a tangible unit capable of performing certain operations and may be configured or arranged in a certain physical manner. In various example embodiments, one or more computer systems (e.g., a standalone computer system, a client computer system, or a server computer system) or one or more hardware modules of a computer system (e.g., a processor or a group of processors) may be configured by software (e.g., an application or application portion) as a hardware module that operates to perform certain operations as described herein.

In some embodiments, a hardware module may be implemented mechanically, electronically, or any suitable combination thereof. For example, a hardware module may include dedicated circuitry or logic that is permanently configured to perform certain operations. For example, a hardware module may be a special-purpose processor, such as a field programmable gate array (FPGA) or an ASIC. A hardware module may also include programmable logic or circuitry that is temporarily configured by software to perform certain operations. For example, a hardware module may include software encompassed within a general-purpose processor or other programmable processor. It will be appreciated that the decision to implement a hardware module mechanically, in dedicated and permanently configured circuitry, or in temporarily configured circuitry (e.g., configured by software) may be driven by cost and time considerations.

Accordingly, the phrase "hardware module" should be understood to encompass a tangible entity, be that an entity that is physically constructed, permanently configured (e.g., hardwired), or temporarily configured (e.g., programmed) to operate in a certain manner or to perform certain operations described herein. As used herein, "hardware-implemented module" refers to a hardware module. Considering embodiments in which hardware modules are temporarily configured (e.g., programmed), each of the hardware modules need not be configured or instantiated at any one instance in time. For example, where a hardware module comprises a general-purpose processor configured by software to become a special-purpose processor, the general-purpose processor may be configured as respectively different special-purpose processors (e.g., comprising different hardware modules) at different times. Software may accordingly configure a processor, for example, to constitute a particular hardware module at one instance of time and to constitute a different hardware module at a different instance of time.

Hardware modules can provide information to, and receive information from, other hardware modules. Accordingly, the described hardware modules may be regarded as being communicatively coupled. Where multiple hardware modules exist contemporaneously, communications may be achieved through signal transmission (e.g., over appropriate circuits and buses) between or among two or more of the hardware modules. In embodiments in which multiple hardware modules are configured or instantiated at different times, communications between such hardware modules may be achieved, for example, through the storage and retrieval of information in memory structures to which the multiple hardware modules have access. For example, one hardware module may perform an operation and store the output of that operation in a memory device to which it is communicatively coupled. A further hardware module may then, at a later time, access the memory device to retrieve and process the stored output. Hardware modules may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions described herein. As used herein, "processor-implemented module" refers to a hardware module implemented using one or more processors.

Similarly, the methods described herein may be at least partially processor-implemented, a processor being an example of hardware. For example, at least some of the operations of a method may be performed by one or more processors or processor-implemented modules. Moreover, the one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., an application program interface (API)).

The performance of certain of the operations may be distributed among the one or more processors, not only residing within a single machine, but deployed across a number of machines. In some example embodiments, the one or more processors or processor-implemented modules may be located in a single geographic location (e.g., within a home environment, an office environment, or a server farm). In other example embodiments, the one or more processors or processor-implemented modules may be distributed across a number of geographic locations.

Some portions of this specification are presented in terms of algorithms or symbolic representations of operations on data stored as bits or binary digital signals within a machine memory (e.g., a computer memory). These algorithms or symbolic representations are examples of techniques used by those of ordinary skill in the data processing arts to convey the substance of their work to others skilled in the art. As used herein, an "algorithm" is a self-consistent sequence of operations or similar processing leading to a desired result. In this context, algorithms and operations involve physical manipulation of physical quantities. Typically, but not necessarily, such quantities may take the form of electrical, magnetic, or optical signals capable of being stored, accessed, transferred, combined, compared, or otherwise manipulated by a machine. It is convenient at times, principally for reasons of common usage, to refer to such signals using words such as "data," "content," "bits," "values," "elements," "symbols," "characters," "terms," "numbers," "numerals," or the like. These words, however, are merely convenient labels and are to be associated with appropriate physical quantities.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or any suitable combination thereof), registers, or other machine components that receive, store, transmit, or display information. Furthermore, unless specifically stated otherwise, the terms "a" or "an" are herein used, as is common in patent documents, to include one or more than one instance. Finally, as used herein, the conjunction "or" refers to a non-exclusive "or," unless specifically stated otherwise.

What is claimed is:

1. A wearable article, comprising:
a structural material configured to enable the wearable article to be worn on a body;
an energy storage device;
a wireless transmission circuit, coupled to the energy storage device, comprising an antenna having a minimum transmission energy, a kinetic energy generator in a configuration, upon manipulation of the structural material, to be manipulated to induce a voltage output, the kinetic energy generator coupled to and configured to charge the energy storage device;
an electronic data storage configured to store data;
wherein, upon the energy storage device charging to at least the minimum transmission energy, the wireless transmission circuit transmits the data as stored in the electronic data storage based on energy discharged, at least in part, from the energy storage device.

2. The wearable article of claim 1, wherein the kinetic energy generator is a piezoelectric generator.

3. The wearable article of claim 2, further comprising a sole, wherein the piezoelectric generator is positioned, at least in part, in contact with the sole.

4. The wearable article of claim 3, wherein the piezoelectric generator is positioned within the sole.

5. The wearable article of claim 3, wherein the sole comprises an insole and an outsole and wherein the piezoelectric generator is positioned on a top surface of the sole outsole and a bottom surface of the insole.

6. The wearable article of claim 2, wherein the piezoelectric generator comprises a plurality of piezoelectric generators and wherein the plurality of piezoelectric generators are positioned in discrete and separate locations in the wearable article.

7. The wearable article of claim 6, wherein a first piezoelectric generator of the plurality of piezoelectric generators is positioned proximate a forefoot of the wearable article and wherein a second piezoelectric generator of the plurality of piezoelectric generators is positioned proximate a heel of the wearable article.

8. The wearable article of claim 6, further comprising a sole comprised of the structural material, wherein the plurality of piezoelectric generators are distributed substantially evenly with respect to the sole.

9. The wearable article of claim 2, further comprising a sole comprised of the structural material and having a major surface, wherein the piezoelectric generator is substantially coextensive to and conformal with the major surface of the sole.

10. The wearable article of claim 2, wherein the piezoelectric generator is configured to generate a discrete energy output less than the minimum transmission energy upon a discrete flexing of the piezoelectric generator, and wherein the energy storage device is configured to charge to at least the minimum transmission energy upon a plurality of discrete flexing events of the piezoelectric generator.

11. The wearable article of claim 1, wherein the energy storage device is a capacitor.

12. The wearable article of claim 1, further comprising a controller configured to cause the wireless transmission circuit to transmit the data, based, at least in part, on receiving an indication that the volatile energy storage device has a charge of at least the minimum transmission energy.

13. The wearable article of claim 1, wherein the electronic data storage is further configured to store identity data of the wearable article and wherein the wireless transmission circuit is further configured to transmit the identity data, upon the energy storage device charging to at least the minimum transmission energy.

14. The wearable article of claim 1, wherein the data is indicative, at least in part, of a number of footsteps for which the article of footwear was worn.

15. A method, comprising:
   outputting, with a kinetic energy generator positioned in contact with a structural material of an article of footwear in a configuration, upon manipulation of the structural material, the kinetic energy generator coupled to and configured to charge a energy storage device;
   storing data in an electronic data storage;
   transmitting, with a wireless transmission circuit, upon the energy storage device charging to at least the minimum transmission energy, the data as stored in the electronic data storage based on energy discharged, at least in part, from the energy storage device.

16. The method of claim 15, wherein the kinetic energy generator is a piezoelectric generator.

17. The method of claim 16, wherein the piezoelectric generator is positioned, at least in part, in contact with a sole of the article of footwear.

18. The method of claim 17, wherein the piezoelectric generator is positioned within the sole.

19. The method of claim 17, wherein the sole comprises an insole and an outsole and wherein the piezoelectric generator is positioned on a top surface of the sole outsole and a bottom surface of the insole.

20. The method of claim 16, wherein the piezoelectric generator comprises a plurality of piezoelectric generators, wherein the plurality of piezoelectric generators are positioned in discrete and separate locations in the article of footwear, and wherein outputting a voltage output is from at least one of the plurality of piezoelectric generators.

21. The method of claim 20, wherein a first piezoelectric generator of the plurality of piezoelectric generators is positioned proximate a forefoot of the wearable article and wherein a second piezoelectric generator of the plurality of piezoelectric generators is positioned proximate a heel of the article of footwear.

22. The method of claim 20, further comprising a sole comprised of the structural material, wherein the plurality of piezoelectric generators are distributed substantially evenly with respect to the sole.

23. The method of claim 16, further comprising a sole comprised of the structural material and having a major surface, wherein the piezoelectric generator is substantially coextensive to and conformal with the major surface of the sole.

24. The method of claim 16, wherein the piezoelectric generator is configured to generate a discrete energy output less than the minimum transmission energy upon a discrete flexing of the piezoelectric generator, and wherein the energy storage device is configured to charge to at least the minimum transmission energy upon a plurality of discrete flexing events of the piezoelectric generator.

25. The method of claim 15, wherein the energy storage device is a capacitor.

26. The method of claim 15, further comprising causing, with a controller, the wireless transmission circuit to transmit the data based, at least in part, on receiving an indication that the energy storage device has a charge of at least the minimum transmission energy.

27. The method of claim 15, wherein the electronic data storage is further configured to store identity data of the article of footwear and further comprising transmitting, with the wireless transmission circuit, the identity data upon the energy storage device charging to at least the minimum transmission energy.

28. The method of claim 15, wherein the data is indicative, at least in part, of a number of footsteps for which the article of footwear was worn.

* * * * *